US009899355B2

(12) United States Patent
Yuan et al.

(10) Patent No.: US 9,899,355 B2
(45) Date of Patent: Feb. 20, 2018

(54) THREE-DIMENSIONAL INTEGRATED CIRCUIT STRUCTURE

(71) Applicant: Taiwan Semiconductor Manufacturing Co., Ltd., Hsin-Chu (TW)

(72) Inventors: Ching-Pin Yuan, Hsinchu (TW); Chen-Hua Yu, Hsinchu (TW); Ming-Fa Chen, Taichung (TW); Sung-Feng Yeh, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/870,006

(22) Filed: Sep. 30, 2015

(65) Prior Publication Data
US 2017/0092626 A1 Mar. 30, 2017

(51) Int. Cl.
*G02B 6/12* (2006.01)
*G02B 6/42* (2006.01)
(Continued)

(52) U.S. Cl.
CPC .......... *H01L 25/074* (2013.01); *H01L 21/768* (2013.01); *H01L 21/76898* (2013.01);
(Continued)

(58) Field of Classification Search
CPC ...... G02B 6/43; H01L 27/0688; H01L 25/167
See application file for complete search history.

(56) References Cited

U.S. PATENT DOCUMENTS 6,097,857 A * 8/2000 Feldman ................. H01L 23/48
385/14
7,251,391 B2 * 7/2007 Murayama ............. G02B 6/421
385/15
(Continued)

OTHER PUBLICATIONS

Yvain Thonnart, "Energy Thrifty Systems—Optical Communications on Interposer for Chip-Multiprocessors," Leti Days Conference, Jun. 25-26, 2014.
(Continued)

*Primary Examiner* — Victor A Mandala
*Assistant Examiner* — Regan J Rundio
(74) *Attorney, Agent, or Firm* — JCIPRNET

(57) ABSTRACT

Provided is a 3DIC structure including first and second IC chips and connectors. The first IC chip includes a first metallization structure, a first optical active component, and a first photonic interconnection layer. The second IC chip includes a second metallization structure, a second optical active component, and a second photonic interconnection layer. The first and second IC chips are bonded via the first and second photonic interconnection layers. The first optical active component is between the first photonic interconnection layer and the first metallization structure. The first optical active component and the first metallization structure are bonded to each other. The second optical active component is between the second photonic interconnection layer and the second metallization structure. The second optical active component and the second metallization structure are bonded to each other.

16 Claims, 26 Drawing Sheets

(51) Int. Cl.
G02B 6/43 (2006.01)
H01L 23/48 (2006.01)
H01L 25/065 (2006.01)
H01L 25/16 (2006.01)
H01L 31/12 (2006.01)
H01L 21/768 (2006.01)
H01L 25/07 (2006.01)
H01L 23/538 (2006.01)
H01L 27/06 (2006.01)
H01L 25/00 (2006.01)
H01L 23/00 (2006.01)

(52) U.S. Cl.
CPC ........ *H01L 23/481* (2013.01); *H01L 23/5384* (2013.01); *H01L 23/5386* (2013.01); *H01L 24/80* (2013.01); *H01L 25/0657* (2013.01); *H01L 25/167* (2013.01); *H01L 25/50* (2013.01); *H01L 27/0688* (2013.01); *G02B 6/12002* (2013.01); *G02B 6/4214* (2013.01); *G02B 6/43* (2013.01); *H01L 31/12* (2013.01); *H01L 2224/18* (2013.01)

(56) References Cited

U.S. PATENT DOCUMENTS

| | | | | |
|---|---|---|---|---|
| 7,277,611 B1* | 10/2007 | Glebov | .............. | G02B 6/12002 385/14 |
| 7,313,294 B2* | 12/2007 | Hsu | .................... | G02B 6/12002 385/129 |
| 7,577,323 B2* | 8/2009 | Iwamori | ............ | G02B 6/12002 257/734 |
| 7,596,289 B2* | 9/2009 | Yamamoto | ......... | G02B 6/12002 385/14 |
| 7,986,862 B2* | 7/2011 | Matsubara | ......... | G02B 6/12002 385/47 |
| 7,991,250 B2* | 8/2011 | Kim | .................... | G02B 6/12002 385/14 |
| 9,057,853 B2* | 6/2015 | Lau | .......................... | G02B 6/43 |
| 9,235,011 B2* | 1/2016 | Takano | .................... | G02B 6/42 |
| 9,236,328 B1* | 1/2016 | Leobandung | ..... | H01L 21/76898 |
| 9,379,276 B2* | 6/2016 | Matsuoka | ............ | G02B 6/4259 |
| 9,411,112 B2* | 8/2016 | Ooi | ...................... | G02B 6/428 |
| 9,651,739 B2* | 5/2017 | Webster | ................ | G02B 6/305 |
| 2012/0251033 A1* | 10/2012 | Matsuoka | ............ | G02B 6/4259 385/8 |
| 2014/0239507 A1* | 8/2014 | Hsiao | ...................... | H01L 25/50 257/774 |
| 2015/0206856 A1* | 7/2015 | Kwok | ................ | G02B 6/12002 257/797 |

OTHER PUBLICATIONS

Patrick Leduc, "Silicon Technologies, A Global Convergence—Interposer and 3D stacking for energy efficient systems," Leti Days Conference, Jun. 25-26, 2014.

* cited by examiner

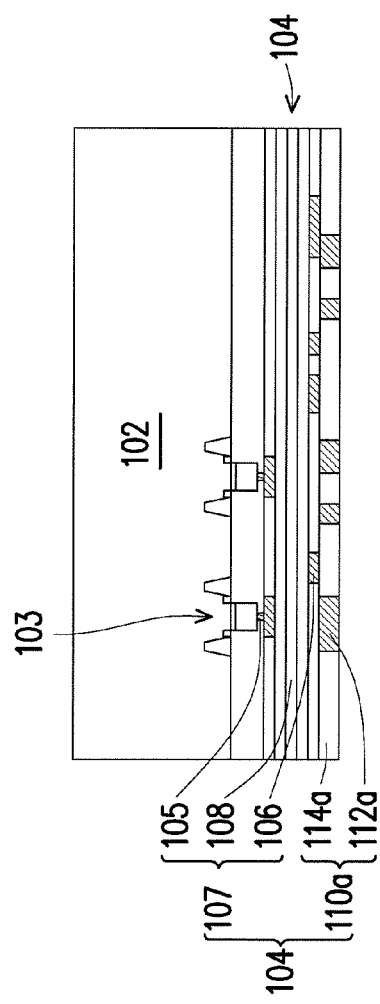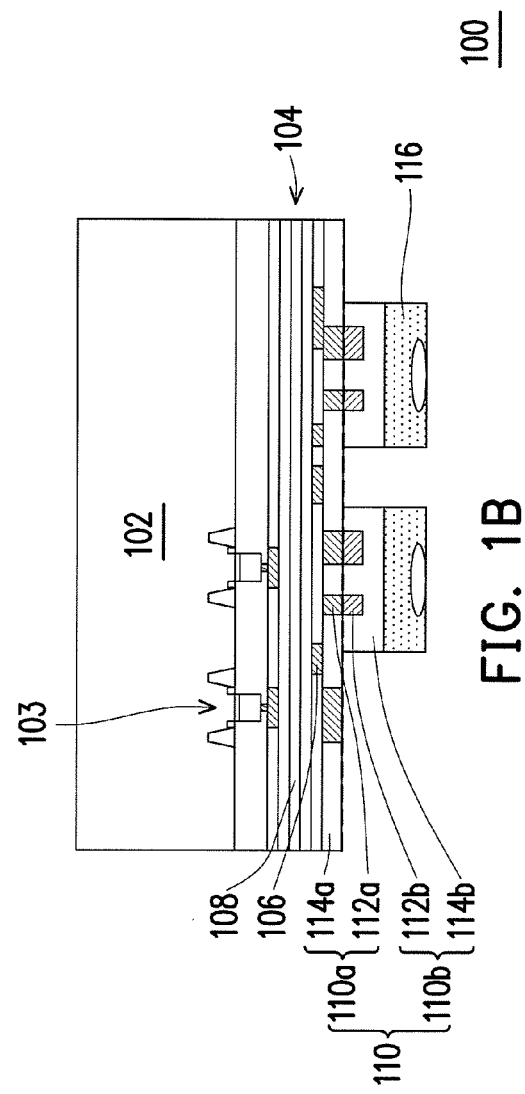
FIG. 1A
FIG. 1B

THREE-DIMENSIONAL INTEGRATED CIRCUIT STRUCTURE

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Exemplary types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

FIGS. 1A to 1F are cross-sectional views of a method of forming a three-dimensional integrated circuit (3DIC) structure in accordance with a first embodiment.

DETAILED DESCRIPTION

Figure 1C:
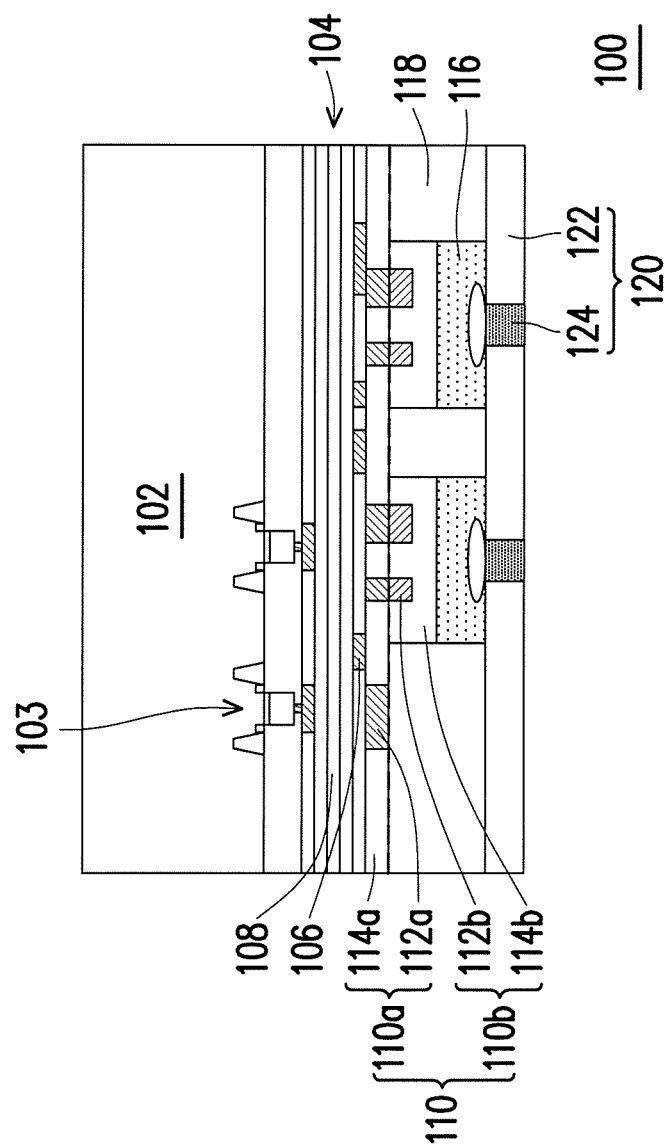

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1F are cross-sectional views of a method of forming a three-dimensional integrated circuit (3DIC) structure in accordance with a first embodiment.

Referring to FIG. 1A, a first semiconductor wafer includes a first semiconductor substrate 102 is provided, which may be made of silicon or other semiconductor materials. Alternatively or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor.

Referring to FIG. 1A, first device regions 103 are formed on the first semiconductor substrate 102 in a front-end-of-line (FEOL) process in some embodiments. One of the first device regions 103 includes a gate structure, source/drain regions, and isolation structures, such as shallow trench isolation (STI) structures (not shown). The first device regions 103 shown in FIG. 1A are merely examples, and other structures may be formed in the first device regions 103. In the first device regions 103, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed on the first semiconductor substrate 102. The functions of the devices may include memory, processors, sensors, amplifiers, power distribution, input/output circuitry, or the like.

Referring to FIG. 1A, a first metallization structure 104 is formed in a back-end-of-line (BEOL) process. The first metallization structure 104 includes a first interconnect structure 107. In some embodiments, the first interconnect structure 107 is formed over the first semiconductor substrate 102, e.g., over the first device regions 103. In some embodiments, the first interconnect structure 107 includes plugs 105 and conductive lines 106. The plugs 105 and the conductive lines 106 are embedded in an insulating material 108. The plugs 105 and the conductive lines 106 may be made of tungsten (W), copper (Cu), copper alloys, aluminum (Al), aluminum alloys, or a combination thereof. In some embodiments, the insulating material 108 is made of silicon oxide, silicon oxynitride, silicon nitride, low dielectric constant (low-k) materials or a combination thereof. In some embodiments, the insulating material 108 may be a single layer or multiple layers.

In some embodiments, a barrier layer (not shown) may be formed between the plugs 105 and the insulating material 108 or between the conductive lines 106 and the insulating material 108 to prevent the material of the plugs 105 or the conductive lines 106 from migrating to the first device regions 103. A material of the barrier layer includes tantalum, tantalum nitride, titanium, titanium nitride, cobalt-tungsten (CoW) or a combination thereof, for example. A method of forming the barrier layer includes, for example, physically vapor deposition (PVD) process.

Referring to FIG. 1A, the first metallization structure 104 further includes a first bonding layer 110a. The first bonding layer 110a is formed over the first interconnect structure 107. The first bonding layer 110a includes first pads 112a embedded in a first dielectric layer 114a. The first pads 112a are connected to the first interconnect structure 107. The first pads 112a may be made of conductive materials such as copper (Cu), copper alloy, aluminum (Al), aluminum alloy, or combinations thereof. Other applicable materials may be included for the first pads 112a. In some embodiments, the first dielectric layer 114a is made of silicon oxide, silicon nitride, polymer or a combination thereof.

Referring to FIG. 1B, a first optical active component 116 is provided and bonded to the first metallization structure 104. In some embodiments, the first optical active component 116 may be a laser source, a detector, a modulator, a photodiode, or a combination thereof, for example. The first optical active component 116 includes a second bonding layer 110b. The second bonding layer 110b includes second pads 112b embedded in a second dielectric layer 114b. The second pads 112b are electrically connected to the first interconnect structure 107. The second pads 112b may be made of conductive materials, such as copper (Cu), copper alloy, aluminum (Al), aluminum alloy, or combinations thereof. Other applicable materials may be included for the second pads 112b. In some embodiments, the second dielectric layer 114b is made of silicon oxide, silicon nitride, a polymer or a combination thereof.

More specifically, before the first optical active component 116 is bonded to the first metallization structure 104, the first bonding layer 110a and the second bonding layer 110b are aligned, such that the first pads 112a can be bonded to the second pads 112b and the first dielectric layer 114a can be bonded to the second dielectric layer 114b. In some embodiments, the alignment of the first bonding layer 110a and the second bonding layer 110b may be achieved by using an optical sensing method. After the alignment is achieved, the first dielectric layer 114a and the second dielectric layer 114b are bonded together by a hybrid bonding to form a first hybrid bonding structure 110. The first bonding layer 110a and the second bonding layer 110b are hybrid bonded together by the application of pressure and heat.

It is noted that the hybrid bonding involves at least two types of bonding, including metal-to-metal bonding and non-metal-to-non-metal bonding such as dielectric-to-dielectric bonding. As shown in FIG. 1B, the first hybrid bonding structure 110 includes first pads 112a and the second pads 112b bonded by metal-to-metal bonding and the first dielectric layer 114a and the second dielectric layer 114b bonded by non-metal-to-non-metal bonding.

Referring to FIG. 1C, a first insulating material 118 is formed aside the first optical active component 116. The first insulating materials 118 may be made of dielectric materials, such as silicon oxide, silicon oxynitride, silicon nitride, low-k materials, or combinations thereof. In some embodiments, the first insulating material layer (not sown) is formed over and aside the first optical active component 116 by using a chemical vapor deposition (CVD) process. Thereafter, the first insulating material layer over the first optical active component 116 is removed by a planarization process such as a chemical mechanical polishing (CMP) process.

Afterwards, a first photonic interconnection layer 120 is formed over the first optical active component 116 and the first insulating materials 118 to form first IC chips 100. The first photonic interconnection layer 120 includes a first dielectric material layer 122 and a second dielectric material layer 124. The second dielectric material layer 124 is embedded in first dielectric material layer 122. In some embodiments, the first dielectric material layer 122 is connected to a top surface of the first optical active component 116. In some embodiments, the first dielectric material layer 122 and the second dielectric material layer 124 have different refractive index. The refractive index of the second dielectric material layer 124 is larger than the refractive index of first dielectric material layer 122. Thus, the second dielectric material layer 124 may serves as a light channel, so as to transmit light generated from the first optical active component 116. In some embodiments, the first dielectric material layer 122 is made of silicon oxide (SiO), and the second dielectric material layer 124 may be made of silicon nitride (SiN), silicon oxynitride (SiON), silicon (Si), or combinations thereof. Other applicable materials may be included for the first dielectric material layer 122 and the second dielectric material layer 124. In some embodiments, the first photonic interconnection layer 120 may includes a plurality of first dielectric material layers and a plurality of second dielectric material layers. The second dielectric material layers are embedded in first dielectric material layer respectively, so as to form a multiple layer structure.

Figure 1D:
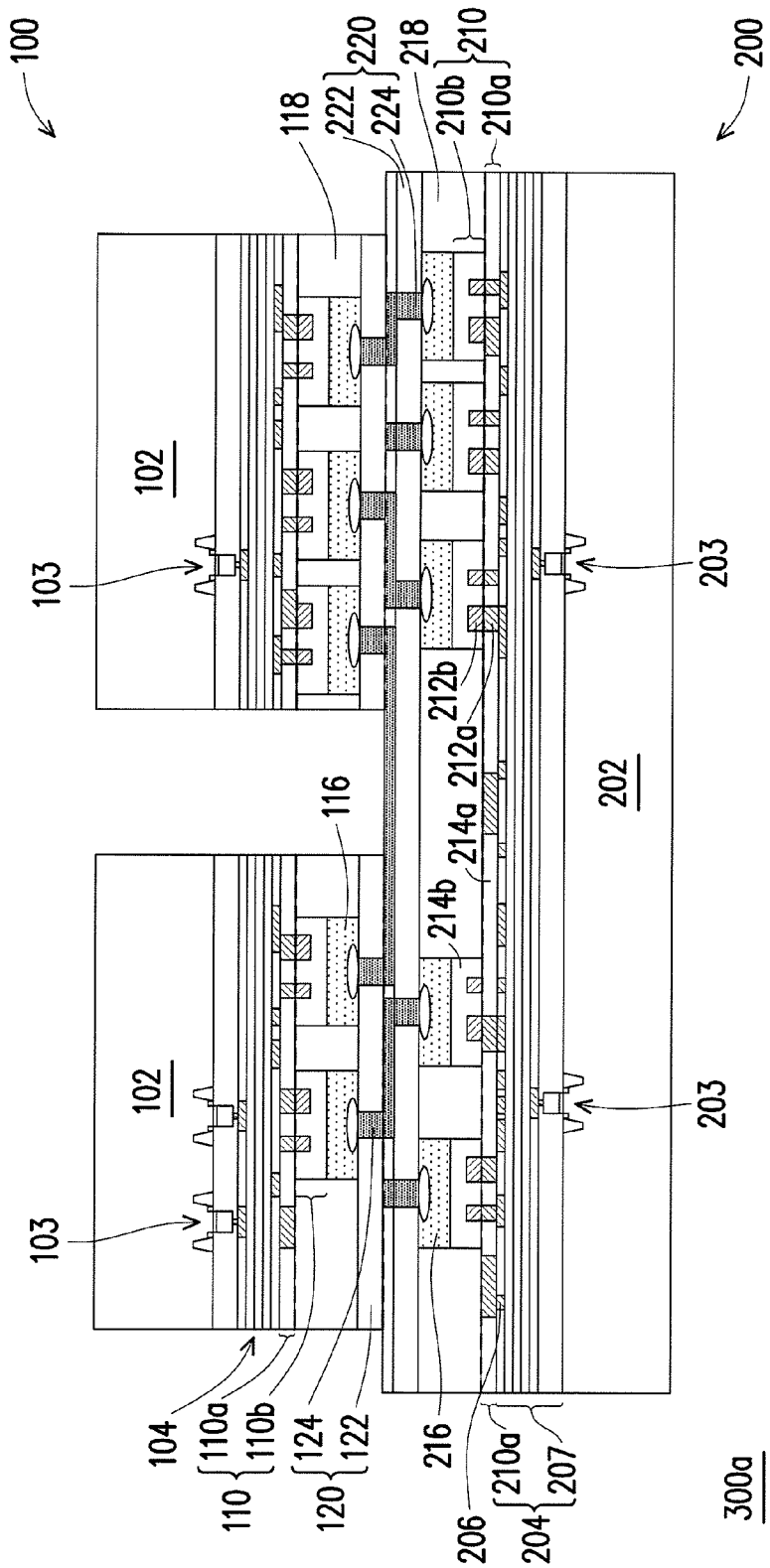

Referring to FIGS. 1C and 1D, a dicing or singulation process is performed to the first semiconductor wafer including the first IC chips 100, so as to separate the first IC chips 100 from each other. In some embodiments, the adhesive layer (not shown) on the backside of the first IC chips 100 is cut through during the die singulation process (not shown). The cutting process used for separating the first IC chips 100 typically involves dicing the wafer with a rotating blade or a laser beam (not shown) along the scribe-line regions. In other words, the dicing or singulation process is, for example, a laser cutting process or a mechanical cutting process.

Referring to FIG. 1D, a second semiconductor wafer 200 is provided. The second semiconductor wafer 200 includes a second semiconductor substrate 202 and second device regions 203. The material and the layout design of the second semiconductor substrate 202 are similar to those of the first semiconductor substrate 102. Similar to the first device regions 103, the second device region 203 may include a gate structure, source/drain regions, and isolation structures.

The second semiconductor wafer 200 further includes a second metallization structure 204, a second optical active component 216, a second insulating material 218, and a second photonic interconnection layer 220. The second metallization structure 204, similar to the first metallization structure 104, includes a second interconnect structure 207 and a third bonding layer 210a. The third bonding layer 210a, similar to the first bonding layer 110a, includes the third pads 212a embedded in the third dielectric layer 214a.

Similar to the first optical active component 116, the second optical active components 216 includes a fourth bonding layer 210b, and the fourth bonding layer 210b includes fourth pads 212b and a fourth dielectric layer 214b. The fourth pads 212b are embedded in the fourth dielectric layer 214b. The material(s) and the designs of the fourth pads 212b and the fourth dielectric layer 214b are similar to those of the second pads 112b and the second dielectric layer 114b respectively. Similar to the second hybrid bonding structure 110, the third dielectric layer 214a and the fourth dielectric layer 214b are bonded together by a hybrid bonding to form a second hybrid bonding structure 210. The third bonding layer 210a and the fourth bonding layer 210b are hybrid bonded together by the application of pressure and heat.

The materials of the second photonic interconnection layer 220 is similar to the material of the first photonic interconnection layer 120, and the second photonic interconnection layer 220 includes a first dielectric layer 222 and a second dielectric layer 224. The material(s) of the first dielectric layer 222, the second dielectric layer 224, and the second insulating material 218 are similar to those of the first dielectric layer 122, the second dielectric layer 124 and the first insulating material 118 respectively.

At least one first IC chip 100 and the second semiconductor wafer 200 are bonded together via the first photonic interconnection layer 120 of the IC chip 100 and the second photonic interconnection layer 220 of the second semiconductor wafer 200. Before the first IC chip 100 is bonded to the second semiconductor wafer 200, the first IC chip 100 and the second semiconductor wafer 200 are aligned, such that the first dielectric layer 122 of the first IC chip 100 can be bonded to the first dielectric layer 222 of the second semiconductor wafer 200. In some embodiments, the alignment of the first IC chip 100 and the second semiconductor wafer 200 may be achieved by using an optical sensing method. After the alignment is achieved, the first IC chip 100 and the second semiconductor wafer 200 are bonded together by dielectric-to-dielectric bonding (such as fusion bonding) to form a stack structure 300a. In some embodiments, dielectric-to-dielectric bonding includes intermolecular interactions. The intermolecular interactions include van der Waals forces, hydrogen bonds or strong covalent bonds. On the other hand, the strength of the intermolecular interactions may be enhanced by the application of pressure and heat. In other words, the first dielectric material layer 122 of the first photonic interconnection layer 120 is bonded with the first dielectric material layer 222 of the second photonic interconnection layer 220, and the second dielectric material layer 124 of the first photonic interconnection layer 120 is bonded with the second dielectric material layer 224 of the second photonic interconnection layer 220. In some embodiments, the IC chips 100 bonded on the second semiconductor wafer 200 include a plurality of dies having different functions, such as dynamic random access memory (DRAM) and bluetooth.

In some embodiments, when the first optical active component 116 of the first IC chip 100 generates the light, the light is transmitted to the second optical active component 216 of the second semiconductor wafer 200 via the second dielectric material layer 124 of the first photonic interconnection layer 120 and the second dielectric material layer 224 of the second photonic interconnection layer 220. In alternative embodiments, when the second optical active component 216 generates the light, the light is transmitted to the first optical active component 116 via the second dielectric material layer 224 of the second photonic interconnection layer 220 and the second dielectric material layer 124 of the first photonic interconnection layer 120. In alternative embodiments, in a 3DIC structure, two first IC chips 100 are bonded to a second semiconductor wafer 200, when the first optical active component 116 of one of the first IC chip 100 generates the light, the light is transmitted to the first optical active component 116 of the other of the first IC chip 100 via the second dielectric material layer 124 of the two first photonic interconnection layers 120 and the second dielectric material layer 224 of the second photonic interconnection layer 220.

Referring to FIG. 1D, after hybrid bonding, the stack structure 300a is put on a tape (not shown) and a thinning process is performed to the backside of the first semiconductor substrate 102 and the backside of the second semiconductor substrate 202. The thinning process may include a grinding process and a polishing process, such as CMP. After the thinning process, a wet etching process is performed to remove the defects formed on the backside of the first semiconductor substrate 102 and the backside of the second semiconductor substrate 202.

Figure 1E:
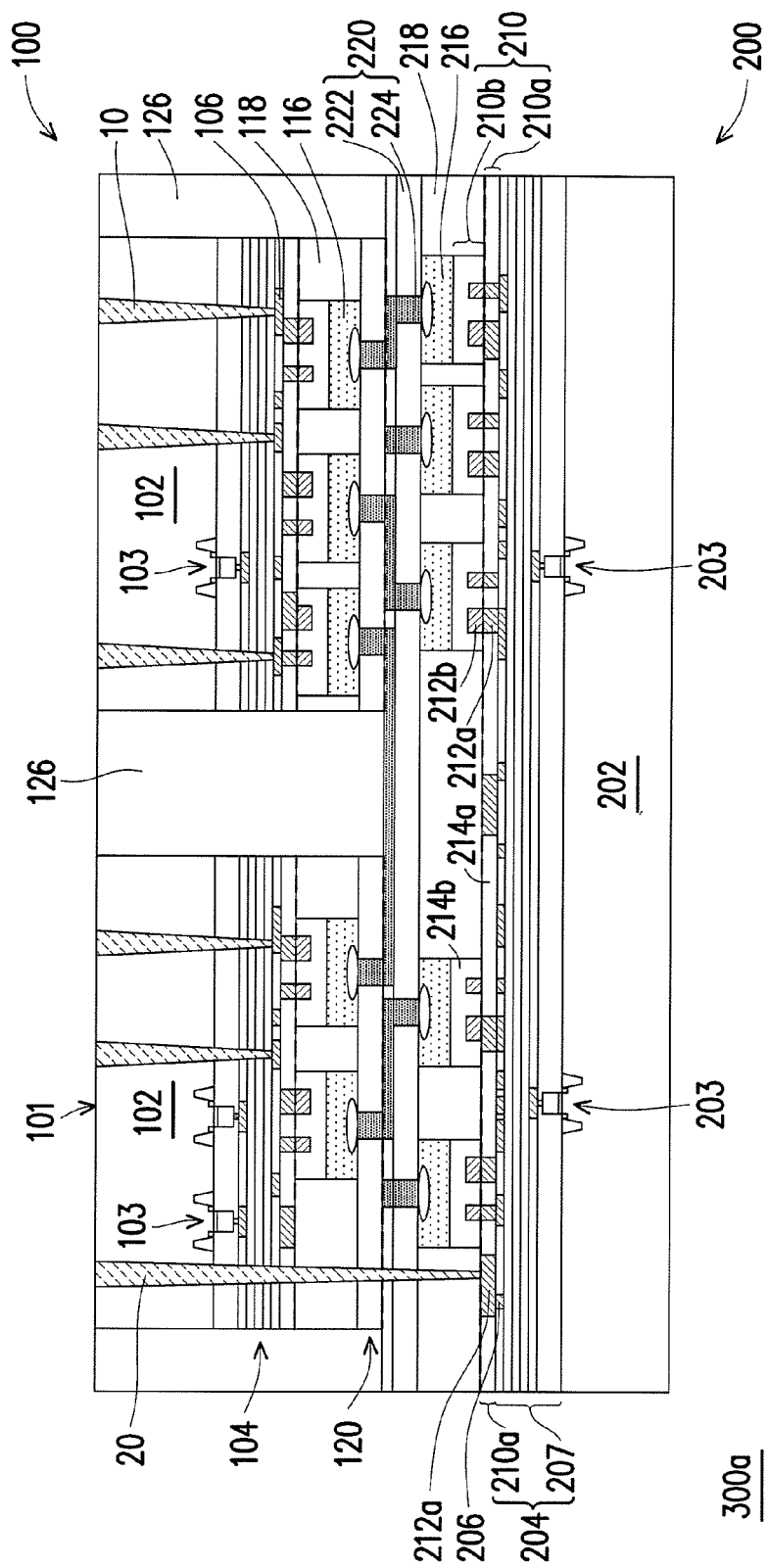

Referring to FIG. 1E, an encapsulant 126 is formed aside the first IC chip 100. More specifically, the encapsulant 126 is formed around the first IC chip 100 and overlays the top surface of the second semiconductor wafer 200. In some embodiments, a material of the encapsulant 126 includes a molding compound including a resin and a filler. On the other hand, in some embodiments, a material of the encapsulant 126 includes an oxide or a nitride, such as silicon oxide, silicon nitride or a combination thereof. The encapsulant 126 may be formed by spin-coating, lamination, deposition or the like. For example, the encapsulant 126 may be formed by firstly forming an encapsulant material (not sown) over and covering the first IC chip 100. Thereafter, the encapsulant material over the first IC chip 100 is removed by a planarization process such as a chemical mechanical polishing (CMP) process. In some embodiments, a portion of the encapsulant material is removed so that a bottom surface 101 of the first IC chip 100 is exposed after planarization process. Thus, the bottom surface 101 of the first IC chip 100 is substantially planar with a top surface of the encapsulant 126.

Referring to FIG. 1E, then, at least one first through-substrate via (TSV) 10 and at least one second through-substrate via 20 are formed. The first TSV 10 and the second TSV 20 are used to provide electrical connections and for heat dissipation for the stack structure 300a.

The first TSV 10 is used to connect one of the conductive lines 106 of the first metallization structure 104 to the backside of the first IC chip 100. More specifically, in some embodiments, the first TSV 10 includes a liner, a diffusion barrier layer, and a conductive via material respectively (not shown). The first TSV 10 is formed by the following processes, for example. Firstly, the stack structure 300a is patterned and at least one first TSV opening is formed penetrating from the backside of the first IC chip 100 to expose one of the conductive lines 106 of the first IC chip 100 by one or more etching processes. In some embodiments, the one of the conductive lines 106 exposed by the first TSV opening is the top conductive line, which is the one the closest to the first optical active component 116. After the first TSV opening is formed, a liner is formed on sidewalls of the first TSV opening to act as an isolation layer such that conductive materials for the first TSV 10 are not in direct contact with the first semiconductor substrate 102. Afterwards, a diffusion barrier layer is conformally formed on the liner. The diffusion barrier layer is used to prevent the to-be-formed conductive via material from migrating to the first device regions 103 and the second device regions 203. Afterwards, the conductive via material is used to fill into the first TSV opening. In some embodiments, the liner is made of an insulating material, such as oxides, nitrides or a combination thereof. In some embodiments, the diffusion barrier layer is made of Ta, TaN, Ti, TiN, CoW or a combination thereof. In some embodiments, the conductive via material is made of copper, copper alloys, aluminum, aluminum alloys, or combinations thereof.

The second TSV 20 is used to connect one of the third pads 212a of the third bonding layer 210a to the backside of the first IC chip 100. In some embodiments, the second TSV 20 is similar to the first TSV 10, and also includes a liner, a diffusion barrier layer, and a conductive via material respectively (not shown). The second TSV 20 is formed by the following processes. Firstly, the stack structure 300a is patterned and a second TSV opening is formed extending from the backside of the first IC chip 100 to expose one of the third pads 212a of the third bonding layer 210a by one or more etching processes. After the second TSV opening is formed, the liner, the diffusion barrier layer, and the conductive via material are respectively formed in the second TSV opening.

Figure 1F:
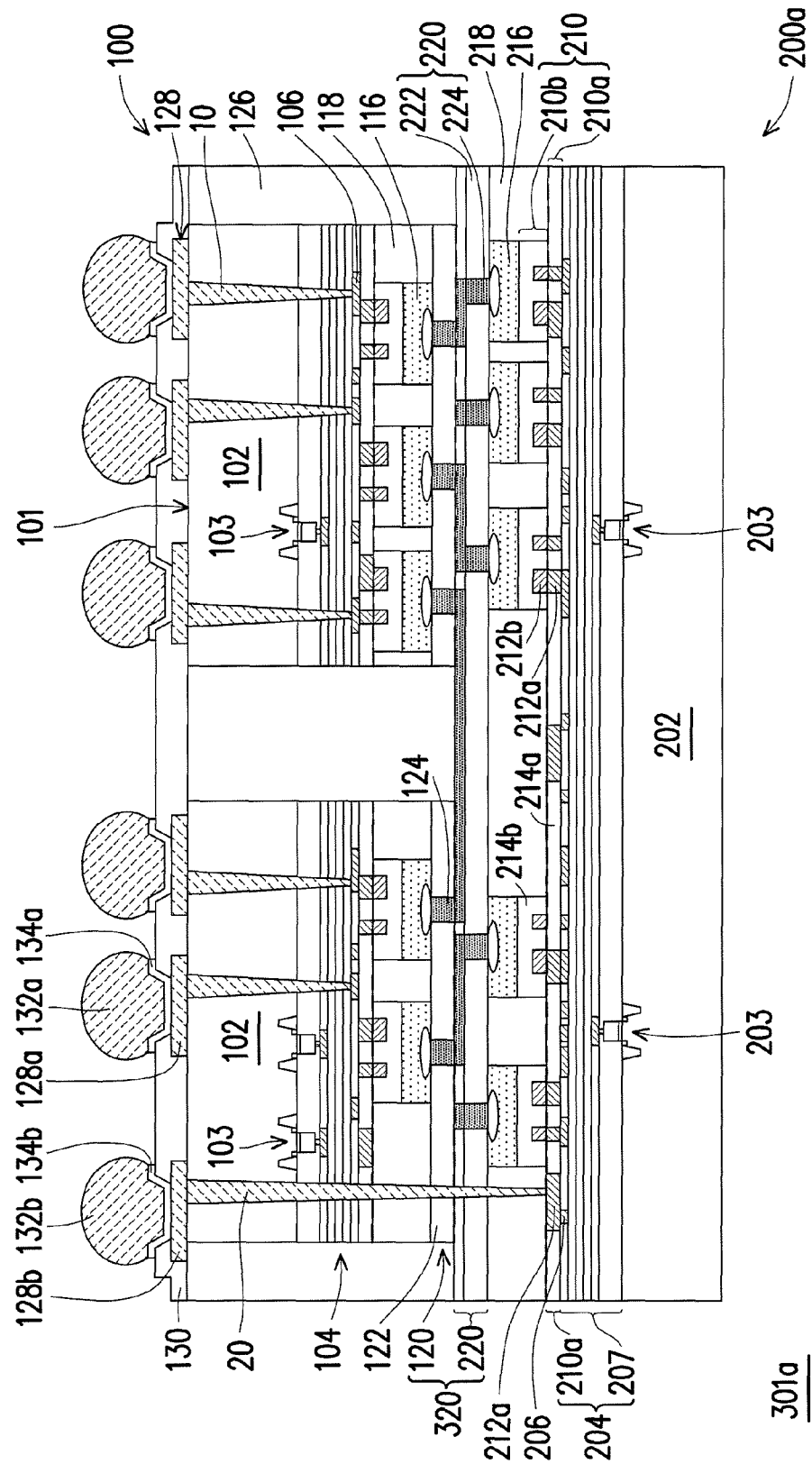

Referring to FIG. 1F, a redistribution (RDL) structure 128 is formed over a bottom surface 101 of the first semiconductor substrate 102. The RDL structure 128 includes at least one first metal pad 128a and at least one second metal pad 128b formed in a passivation layer 130. The first metal pad 128a is electrically connected to the first TSV 10, and the second metal pad 128b is electrically connected to the second TSV 20. In some embodiments, the first metal pad 128a and the second metal pad 128b may be made of conductive materials with low resistivity, such as copper (Cu), aluminum (Al), Cu alloys, Al alloys, or other applicable materials. Although FIG. 1F only shows one RDL structure 128, more than one RDL structures may be formed.

At least one first connector 132a and a second connector 132b (such as solder ball, conductive pillar, conductive pillar with solder cap, etc.) are formed over the first metal pads 128a and the second pad 128b respectively. The first connector 132a is connected to the first metal pad 128a, and the second connector 132b is connected to the second metal pad 128b. In some embodiments, a first under bump metallization (UBM) layer 134a is formed between the first connector 132a and the first metal pad 128a, and a second UBM layer 134b is formed between the second connector 132b and the second metal pad 128b. The first UBM layer 134a and the second UBM layer 134b may contain an adhesion layer and/or a wetting layer. In some embodiments, the first UBM layer 134a and the second UBM layer 134b may be made of titanium (Ti), titanium nitride (TiN), tantalum nitride (TaN), tantalum (Ta), or the like. In some embodiments, the first UBM layer 134a and the second UBM layer 134b further include a copper seed layer respectively. In some embodiments, the first connector 132a and the second connector 132b may be made of conductive materials with low resistivity, such as solders or solder alloys. Exemplary elements included in the solder alloys include Sn, Pb, Ag, Cu, Ni, Bi or combinations thereof.

The first TSV 10 and the second TSV 20 individually provide different functions. The first IC chip 100 may be electrically connected to another package structure (not shown) via the RDL structure 128 and the first TSV 10. The second semiconductor wafer 200 is electrically connected to the first IC chip 100 via the second TSV 20, and may be electrically connected to another package structure (not shown) via the RDL structure 128 and the second TSV 20. The first TSV 10 and the second TSV 20 provide fast conductive paths to connect the first IC chip 100, the second semiconductor wafer 200, and/or other package structures, without the formation of complicated metal routings.

Referring to FIG. 1F, a dicing or singulation process is performed to the stack structure 300a, so as to separate 3DIC structures 301a from each other. In some embodiments, the dicing or singulation process is, for example, a laser cutting process or a mechanical cutting process. In some embodiments, one of 3DIC structures 301a includes the first IC chip 100 and the second IC chip 200a. The first IC chip 100 includes the first optical active component 116. The second IC chip 200a includes the second optical active component 216. The first IC chip 100 and the second IC chip 200a are bonded via a photonic bonding structure 320. The photonic bonding structure 320 is located between the first optical active component 116 and the second optical active component 216. The photonic bonding structure 320 is a combination of the first photonic interconnection layer 120 of the first IC chip 100 and the second photonic interconnection layer 220 of the second IC chip 200a, for example.

Figure 2:
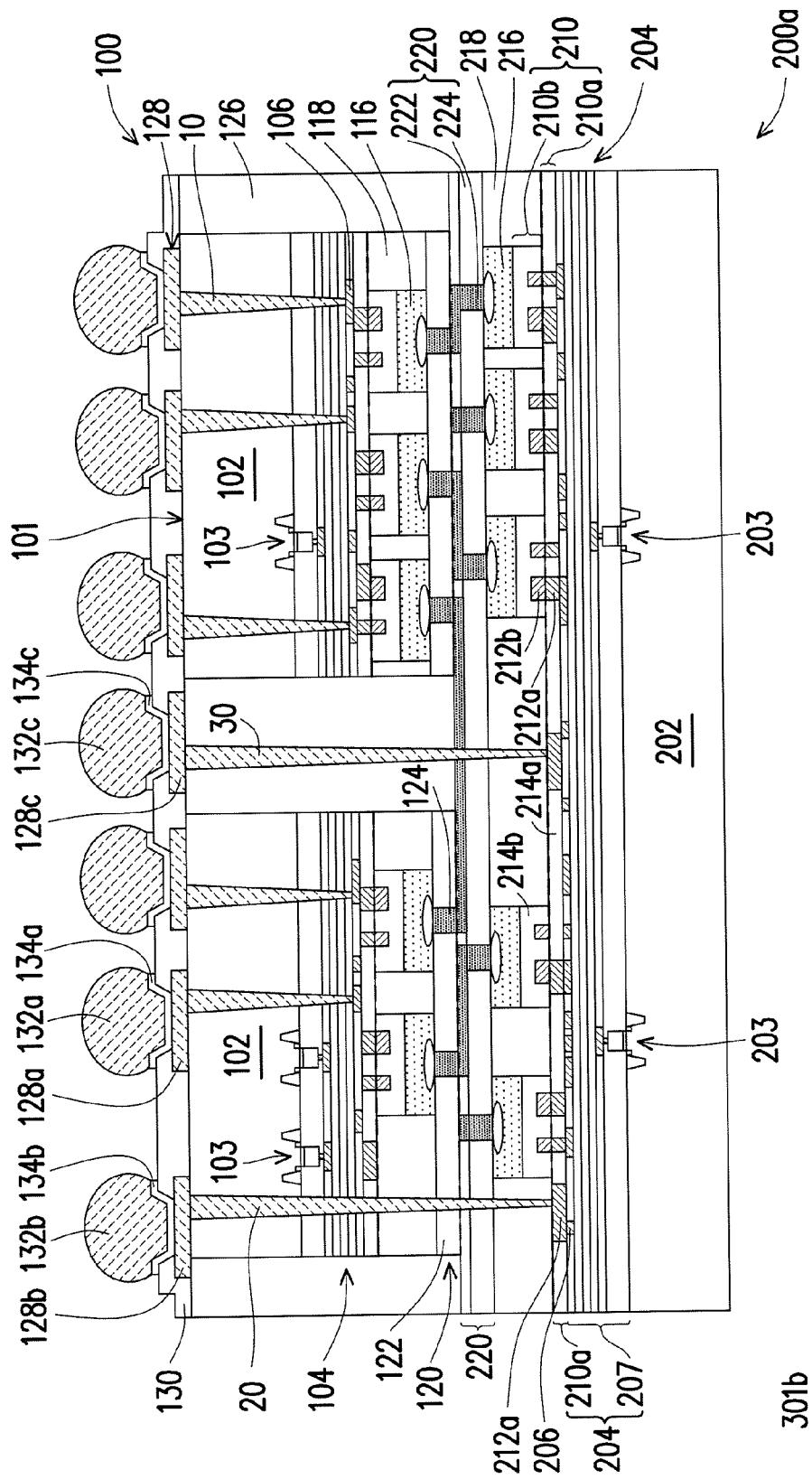
FIG. 2 is a cross-sectional view of a 3DIC structure in accordance with a second embodiment.

FIG. 2 is a cross-sectional view of a 3DIC structure in accordance with a second embodiment.

With reference to FIG. 2, a 3DIC structure 301b of the second embodiment is similar to the 3DIC structure 301a of the first embodiment. A difference therebetween lies in that the 3DIC structure 301b of the second embodiment further includes at least one through dielectric via (TDV) 30, a third UBM layer 134c, a third metal pad 128c, and a third connector 132c. The TDV 30 penetrates the bottom surface 101 of a first IC chip 100 and reaches the third bonding layer 210a. The TDV 30 includes a diffusion barrier layer and a conductive via material respectively (not shown). The TDV 30 is formed by the following processes, for example. Firstly, the 3DIC structure 301b is patterned and a through dielectric opening is formed extending from the bottom surface 101 of the first IC chip 100 to expose the third bonding layer 210a by one or more etching processes. After the through dielectric opening is formed, a diffusion barrier layer is conformally formed on the through dielectric opening. The diffusion barrier layer is used to prevent conductive via material which is formed later from migrating to the first device regions 103 and the second device regions 203. Afterwards, conductive via material is used to fill into the through dielectric opening. In some embodiments, the diffusion barrier layer is made of Ta, TaN, Ti, TiN, CoW or a combination thereof. In some embodiments, conductive via material is made of copper, copper alloy, aluminum, alloys, or combinations thereof. The third connector 132c is electrically connected to the third bonding layer 210a via the third UBM layer 134c, the third metal pad 128c, and the TDV 30. The structures, materials and forming methods of the third connector 132c, the third UBM layer 134c, and the third metal pad 128c are respectively the first connector 132a, the first UBM layer 134a, and the first metal pad 128a of the first embodiments. Thus, details thereof are omitted here.

Figure 3A:
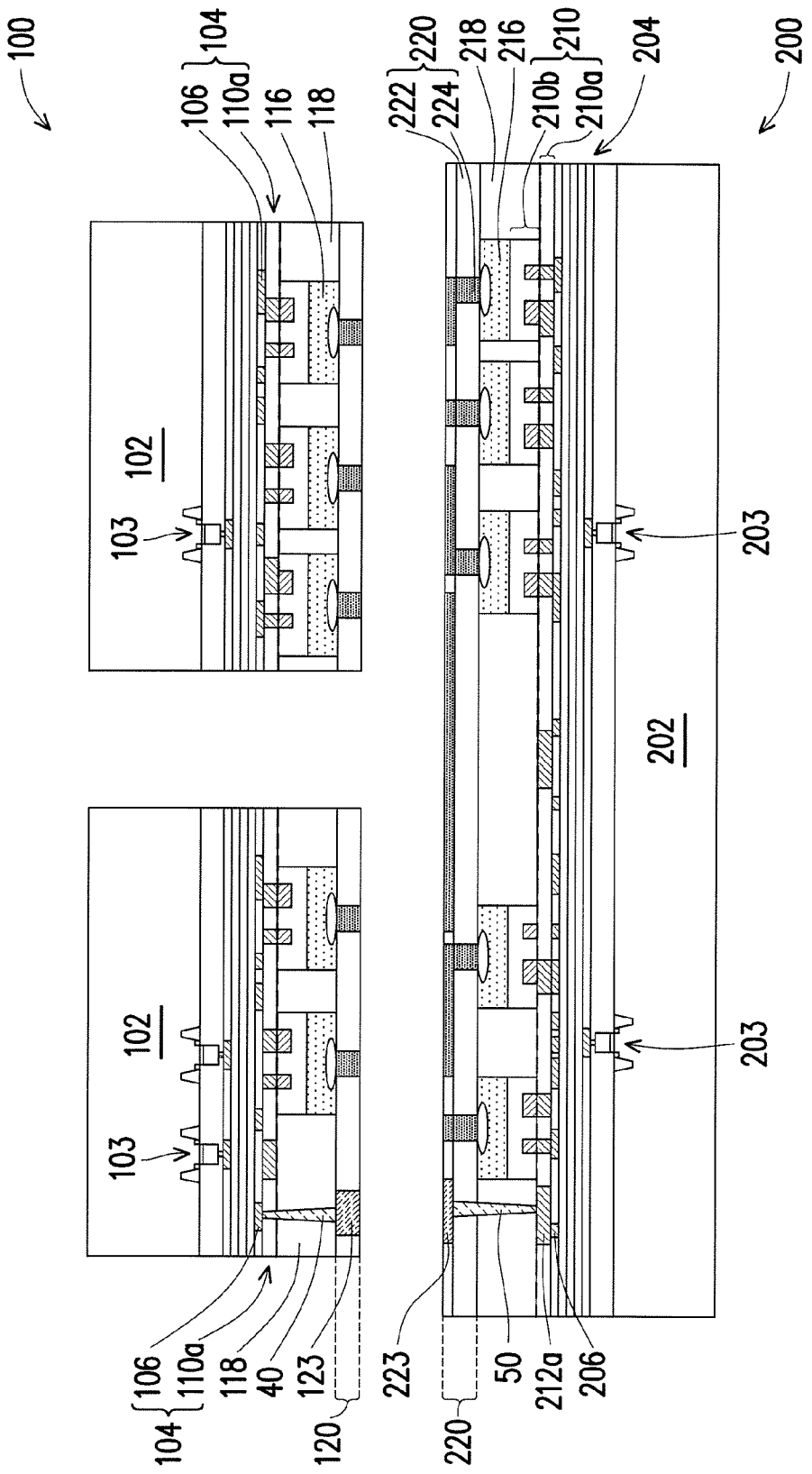
FIGS. 3A to 3C are cross-sectional views of a method of forming a three-dimensional integrated circuit (3DIC) structure in accordance with a third embodiment.
Figure 3B:
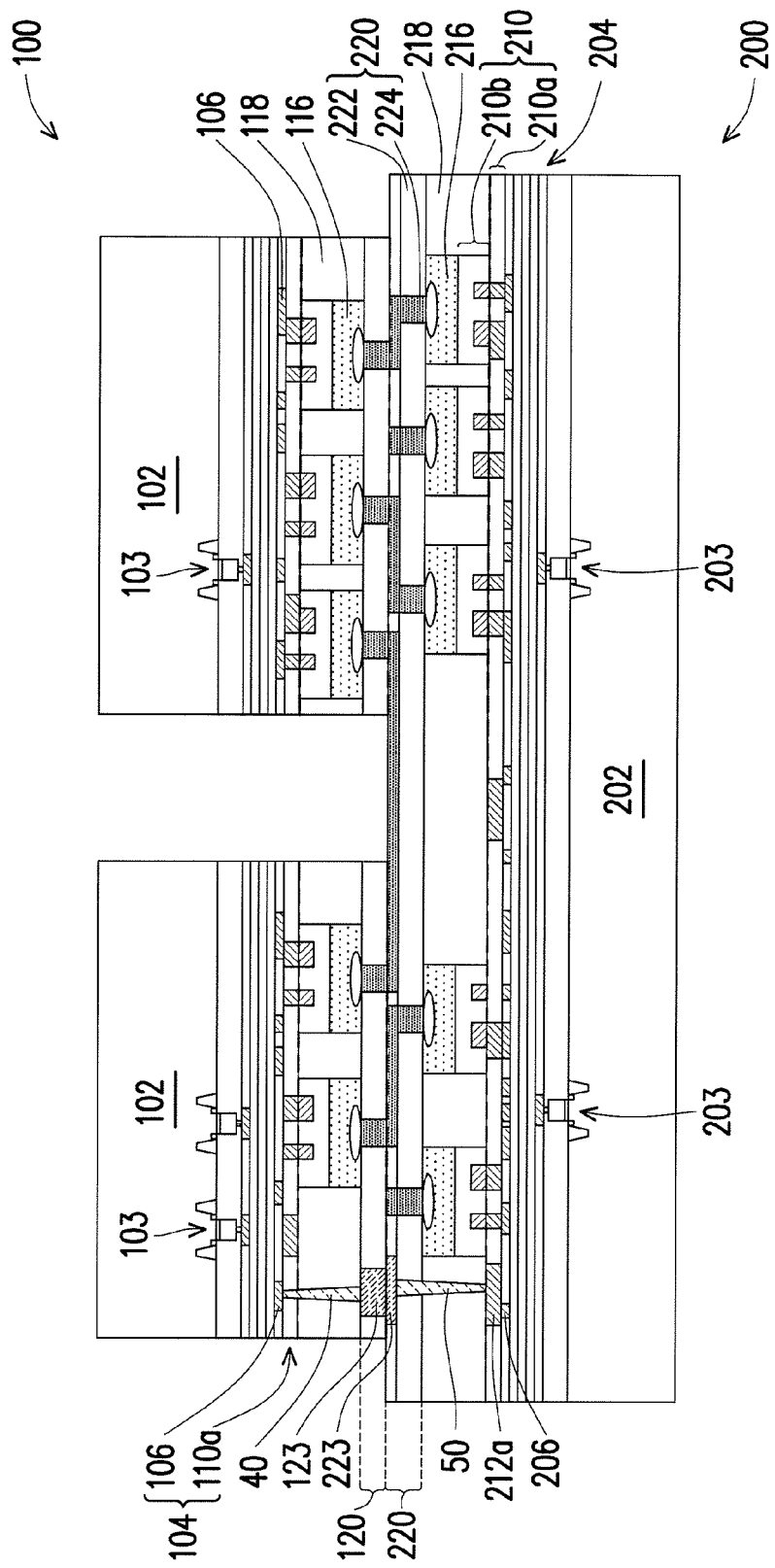
Figure 3C:
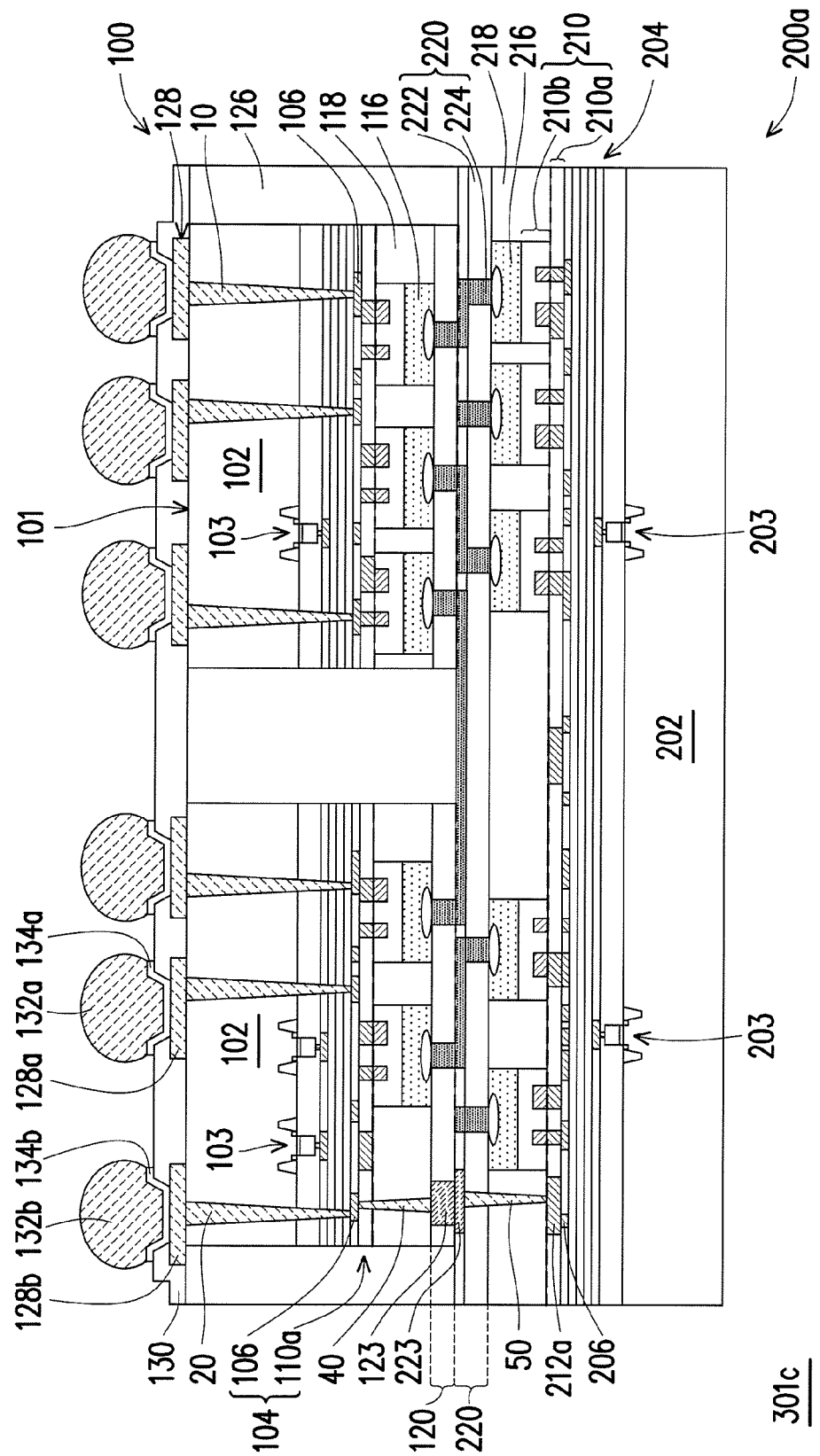

FIGS. 3A to 3C are cross-sectional views of a method of forming a three-dimensional integrated circuit (3DIC) structure in accordance with a third embodiment.

With reference to FIG. 1F and FIG. 3C, a 3DIC structure 301c of the third embodiment is similar to the 3DIC structure 301a of the first embodiment. A difference therebetween lies in that, in 3DIC structure 301c of the third embodiment, the second TSV 20 of the first embodiment is replaced by a second TSV 20, a first via 40, a first conductive material 123, a second conductive material 223, and a second via 50. The second TSV 20 extends from the bottom surface 101 of a first IC chip 100 to a conductive line layer 106 of a first metallization structure 104. The first via 40 passes through a first insulating material 118 and a first bonding layer 110a to connect with the conductive line layer 106 of the first metallization structure 104. The first conductive material 123 is embedded in a first photonic interconnection layer 120 and connected with the first via 40. The second conductive material 223 is embedded in a second photonic interconnection layer 220 and is bonded to the first conductive material 123 by metal-to-metal bonding. The second via 50 is connected with the second conductive material 223 and passes through the second photonic interconnection layer 220 and a second insulating material 218 to connect with the third bonding layer 210a. The second connector 132b is electrically connected with the third bonding layer 210a of the second metallization structure 204 via the second UBM layer 134b, the second metal pad 128b, the second TSV 20, the conductive line layer 106 of the first metallization structure 104, the first via 40, the first conductive material 123, the second conductive material 223 and the second via 50.

With reference to FIG. 3A, the method for manufacturing the 3DIC structure 301c of the third embodiment is similar to that of the 3DIC structure 301a of the first embodiment. The difference therebetween is described as follows: after the first optical active component 116 and the first bonding layer 110a of the first metallization structure 104 are bonded, the first via 40 may be formed in the first insulating material 118 and the first bonding layer 110a to connect with the conductive line layer 106 of the first metallization structure 104. The first conductive material 123 may be embedded in the first photonic interconnection layer 120 to connect with the first via 40 after the first photonic interconnection layer 120 is formed. Alternatively, the first conductive material 123 and the first via 40 may be formed by a dual damascene process after the first optical active component 116 and the first metallization structure 104 are bonded and the first photonic interconnection layer 120 is formed. Likewise, the second via 50 may be formed in the second insulating material 218 aside the second optical active component 216 to connect with the third bonding layer 210a of the second metallization structure 214 after the second optical active component 216 and the third bonding layer 210a of the second metallization structure 214 are bonded. The second conductive material 223 may be embedded in the second photonic interconnection layer 220 to connect with the second via 50 after the second photonic interconnection layer 220 is formed. Alternatively, after the second optical active component 216 and the second metallization structure 214 are bonded and after the second photonic interconnection layer 220 is formed, the second conductive material 223 and the second via 50 may be formed by a dual damascene process. A material of the first via 40, the first conductive material 123, the second conductive material 223, and the second via 50 includes copper, copper alloy, aluminum, alloys, or combinations thereof, for example. In some embodiments, the first via 40, the first conductive material 123, the second conductive material 223, and the second via 50 may further include a barrier layer (not shown) respectively. The barrier layer is made of Ta, TaN, Ti, TiN, CoW or a combination thereof, for example.

With reference to FIG. 3B, when the first IC chip 100 and the second semiconductor wafer 200 are bonded, the first photonic interconnection layer 120 and the second photonic interconnection layer 220 are bonded by dielectric-to-dielectric bonding, and furthermore, the first conductive material 123 and the second conductive material 223 are also bonded by metal-to-metal bonding. Therefore, the first IC chip 100 and the second semiconductor wafer 200 are bonded by hybrid bonding. The hybrid bonding includes dielectric-to-dielectric bonding and metal-to-metal bonding, for example.

With reference to FIG. 3C, after an encapsulant 126 is formed, the first TSV 10 and the second TSV 20 are formed. The structure and forming method of the first TSV 10 and the second TSV 20 of the third embodiment are similar to those of the first TSV 10 of the first embodiment. Thus, details thereof are omitted here. Thereafter, the subsequent processes are performed according to the method of the first embodiment.

Figure 4:
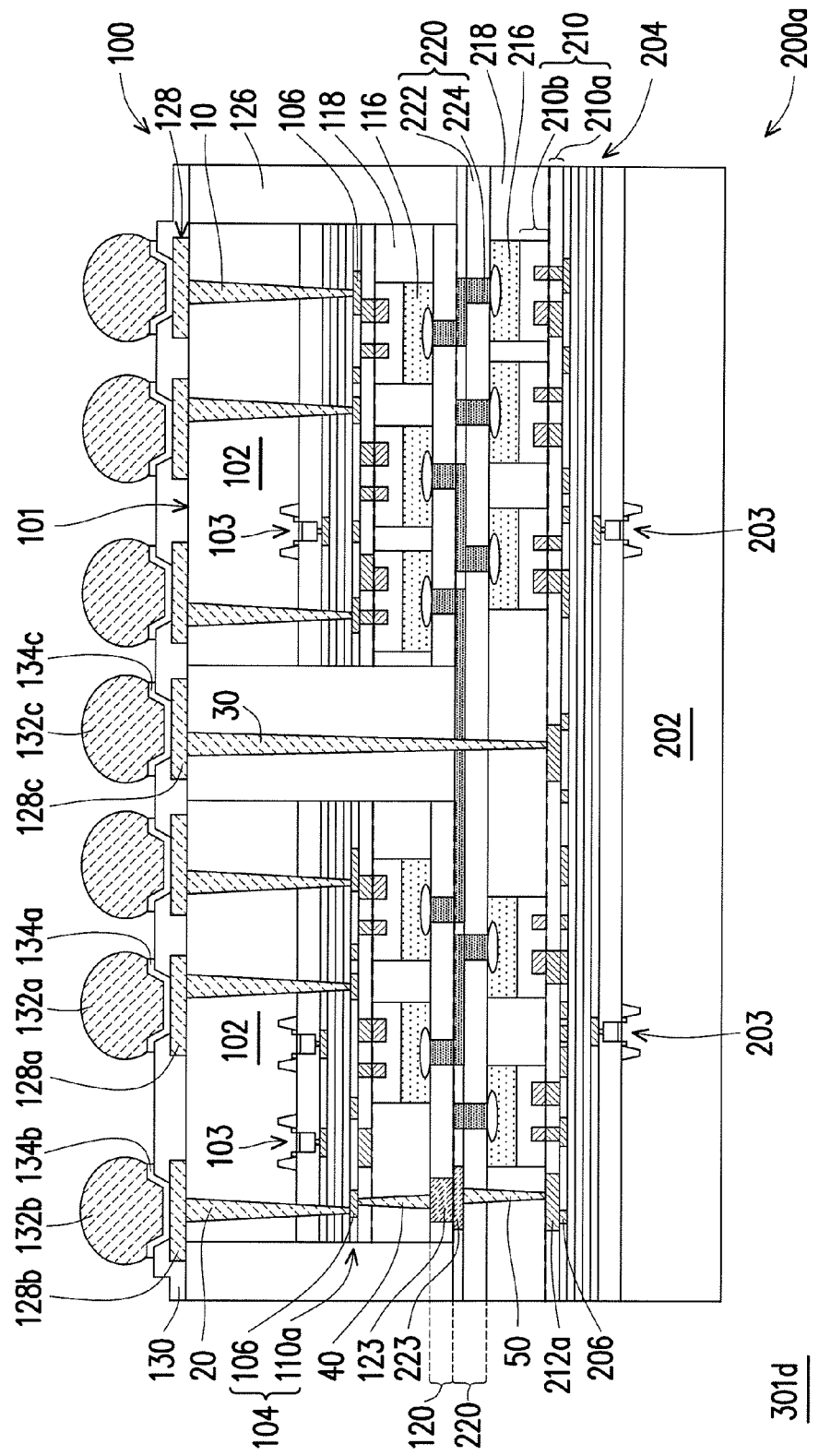
FIG. 4 is a cross-sectional view of a 3DIC structure in accordance with a fourth embodiment.

FIG. 4 is a cross-sectional view of a 3DIC structure in accordance with a fourth embodiment.

With reference to FIG. 4, a 3DIC structure 301d of the fourth embodiment is similar to the 3DIC structure 301c of the third embodiment. A difference therebetween lies in that the 3DIC structure 301d of the fourth embodiment further includes a TDV 30, a third UBM layer 134c, a third metal pad 128c, and a third connector 132c. The structures, materials and forming methods of the third connector 132c, the third UBM layer 134c, and the third metal pad 128c and TDV 30 are respectively the same as those of the second embodiments. Thus, details thereof are omitted here.

FIGS. 5A to 5D are cross-sectional views of a method of forming a 3DIC structure in accordance with a fifth embodiment.

Figure 5A:
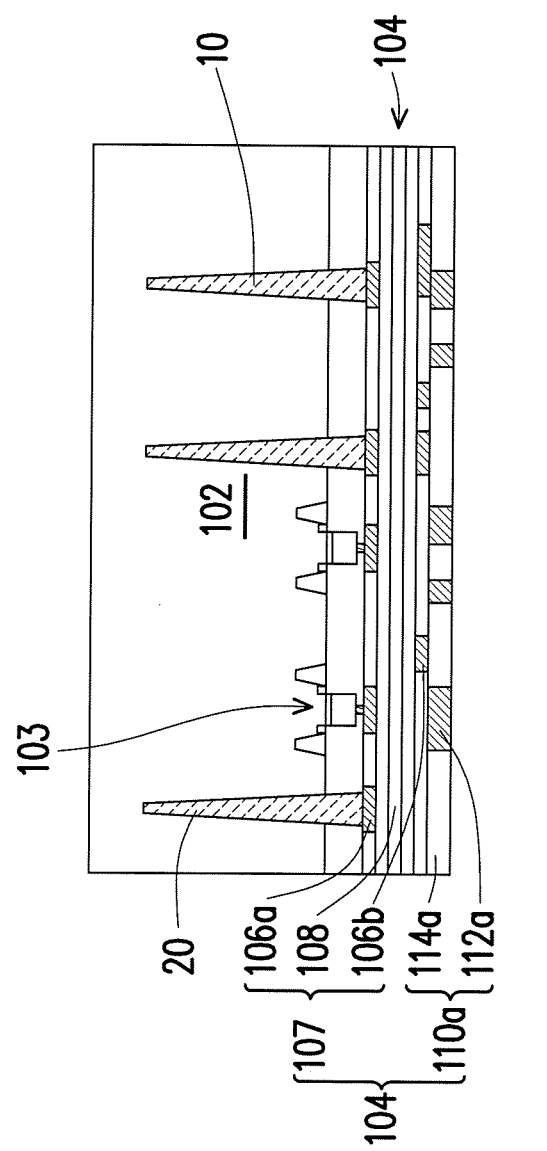
FIGS. 5A to 5D are cross-sectional views of a method of forming a 3DIC structure in accordance with a fifth embodiment.
Figure 5B:
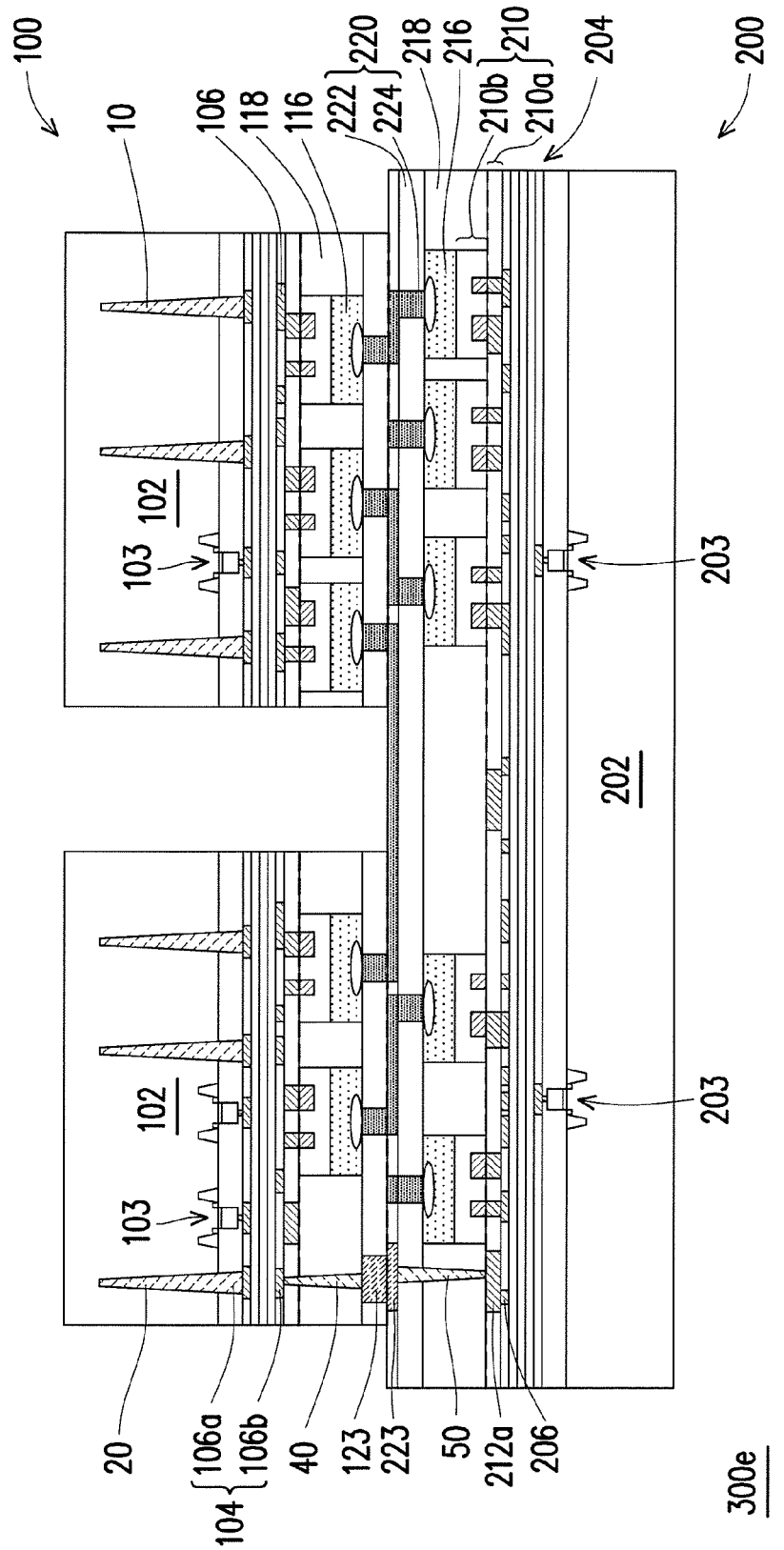
Figure 5C:
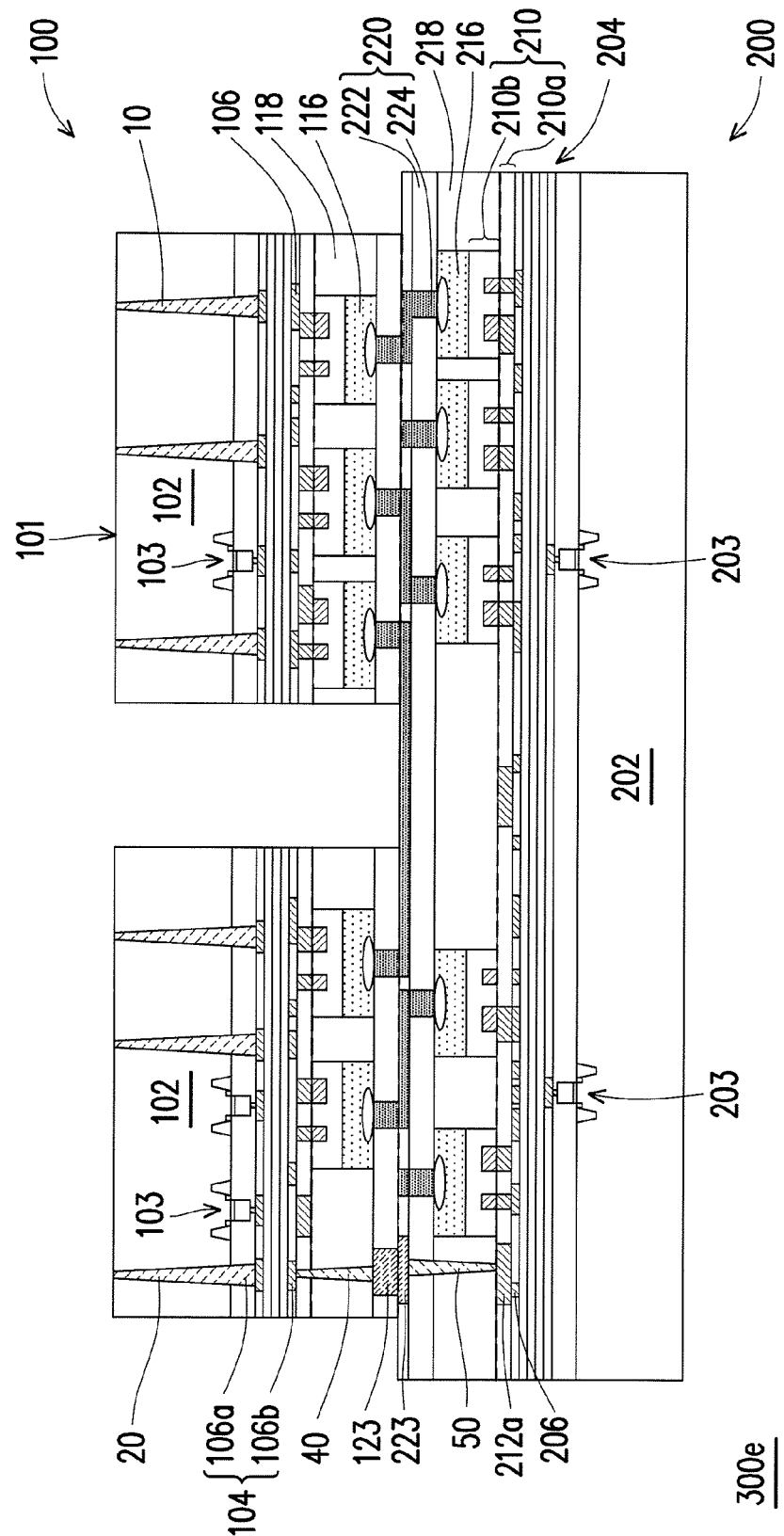
Figure 5D:
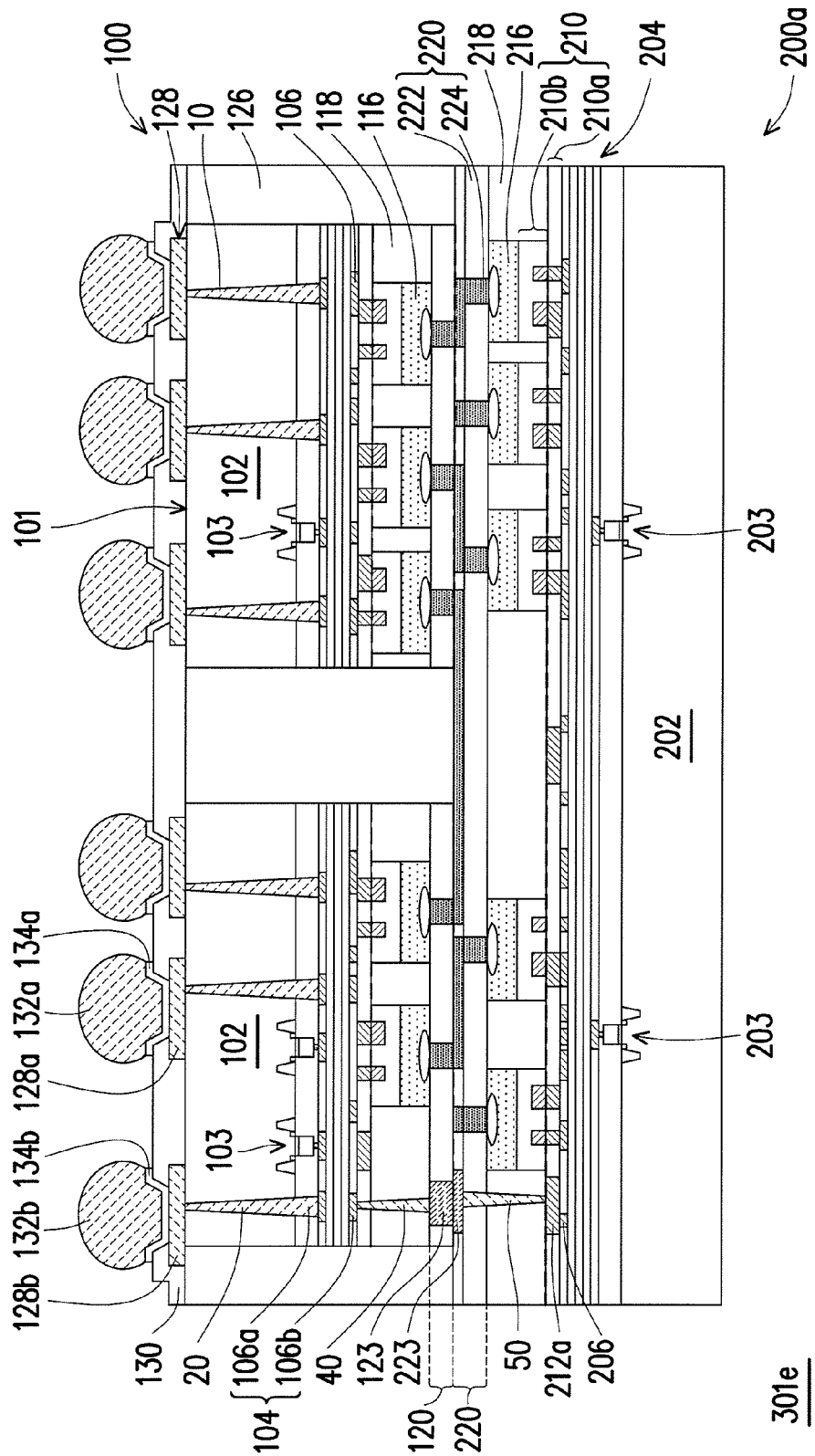

With reference to FIG. 5D, a 3DIC structure 301e of the fifth embodiment is similar to the 3DIC structure 301c of the third embodiment. A difference therebetween lies in that a first TSV 10 and a second TSV 20 in the 3DIC structure 301c of the third embodiment are formed by a via last method while the first TSV 10 and the second TSV 20 in the 3DIC structure 301e of the fifth embodiment are formed by a via first method.

With reference to FIG. 5A, more specifically, the first TSV 10 and the second TSV 20 are formed in a first semiconductor substrate 102 before a first metallization structure 104 is formed. In some embodiments, the first TSV 10 and the second TSV 20 are formed in the first semiconductor substrate 102 after first device regions 103 are formed. The first TSV 10 and the second TSV 20 extend from the front surface toward the back surface of the first semiconductor substrate 102 but does not penetrate the back surface of the first semiconductor substrate 102. The first metallization structure 104 is formed after the first TSV 10 and the second TSV 20 are formed in the first semiconductor substrate 102. A first conductive line layer 106a of the first metallization structure 104 is electrically connected with the first TSV 10 and the second TSV 20. A second conductive line layer 106b of the first metallization structure 104 is a top conductive line layer, for example, and may be electrically connected with the first conductive line layer 106a via other portions of the first metallization structure 104, so as to be electrically connected with the first TSV 10 and the second TSV 20. The first bonding layer 110a of the first metallization structure 104 may be electrically connected with the second conductive line layer 106b of the first metallization structure 104.

With reference to FIG. 5B, a first via 40, a first conductive material 123, a second conductive material 223, and a second via 50 may be formed by the method of the third embodiment. After the first via 40, the first conductive material 123, the second conductive material 223 and the second via 50 are formed, the first IC chip 100 and a second semiconductor wafer 200 are bonded by hybrid bonding.

With reference to FIG. 5C, after the first IC chip 100 and the second semiconductor wafer 200 are bonded, a thinning process of the first semiconductor substrate 102 is performed, by which the back surface of the first semiconductor substrate 102 is polished to remove an excess of the first semiconductor substrate 102, so as to expose the first TSV 10 and the second TSV 20.

With reference to FIG. 5D, an encapsulant 126 is formed by the method of the third embodiment and then the subsequent processes are performed until a first connector 132a and a second connector 132b are formed. The first connector 132a is electrically connected with a first optical active component 116 via a first UBM layer 134a, a first metal pad 128a, the first TSV 10, and the first metallization structure 104. The second connector 132b is electrically connected with a second metallization structure 204 of the second semiconductor wafer 200 via a second UBM layer 134b, a second metal pad 128b, the second TSV 20, the first metallization structure 104, the first via 40, the first conductive material 123, the second conductive material 223, and the second via 50.

Figure 6:
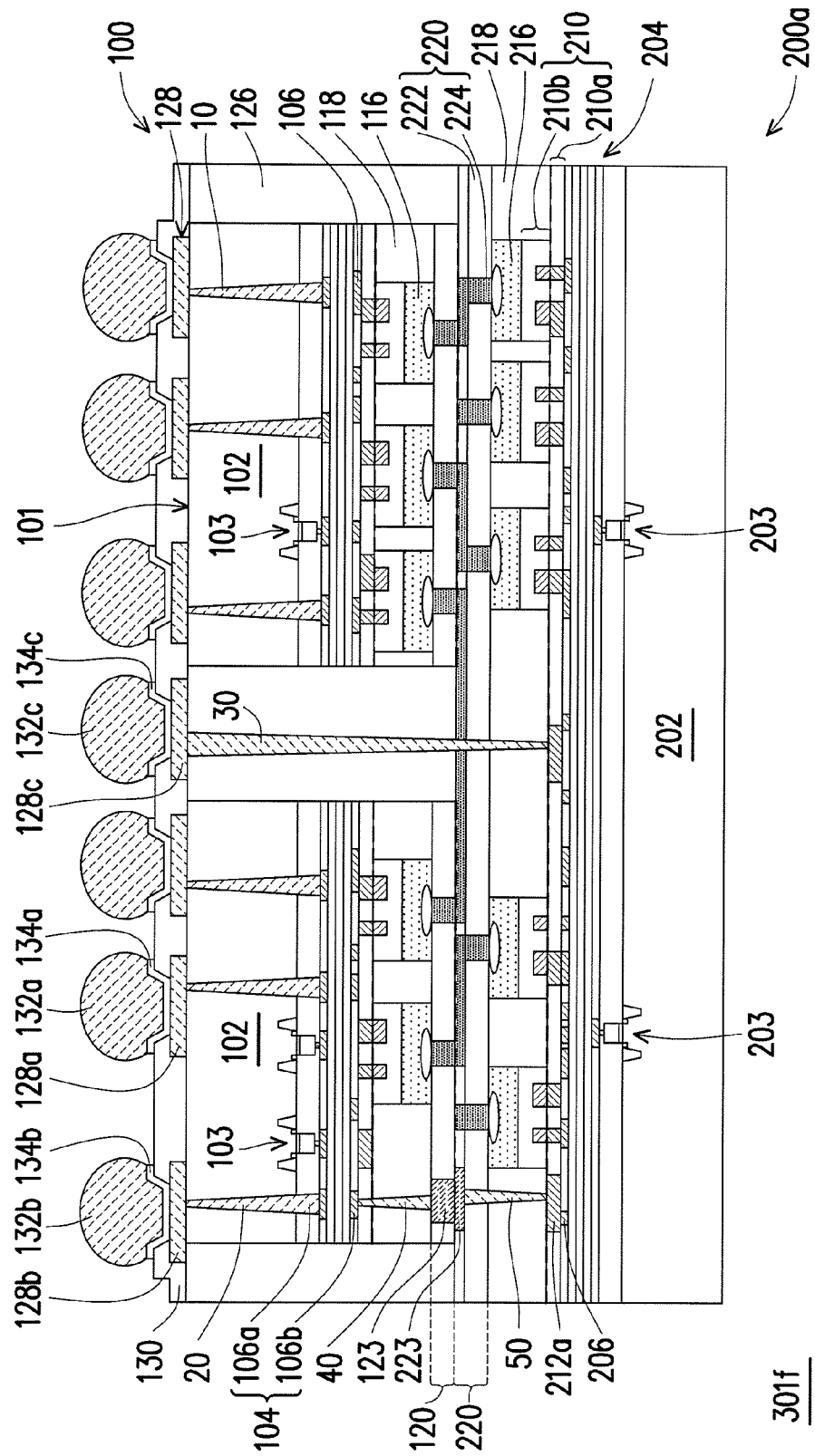
FIG. 6 is a cross-sectional view of a 3DIC structure in accordance with a sixth embodiment.

FIG. 6 is a cross-sectional view of a 3DIC structure in accordance with alternative embodiments.

With reference to FIG. 6, a 3DIC structure 301f of the sixth embodiment is similar to the 3DIC structure 301e of the fifth embodiment. A difference therebetween lies in that the 3DIC structure 301f of the sixth embodiment further includes a through dielectric via 30, a third UBM layer 134c, a third metal pad 128c, and a third connector 132c. The structures, materials and forming methods of the third connector 132c, the third UBM layer 134c, and the third metal pad 128c and TDV 30 are respectively the same as those of the second embodiments. Thus, details thereof are omitted here.

FIGS. 7A to 7D are cross-sectional views of a method of forming a 3DIC structure in accordance with a seventh embodiment.

Figure 7A:
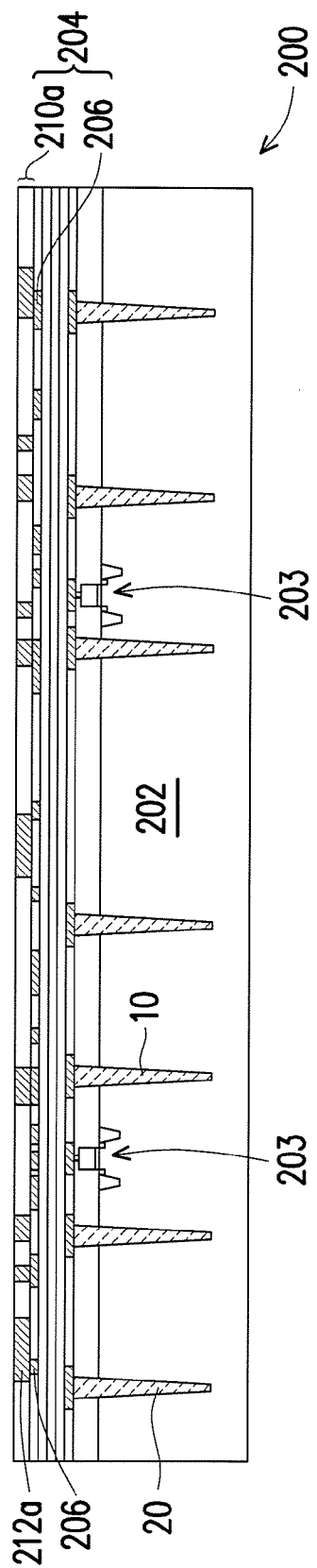
FIGS. 7A to 7D are cross-sectional views of a method of forming a 3DIC structure in accordance with a seventh embodiment.
Figure 7B:
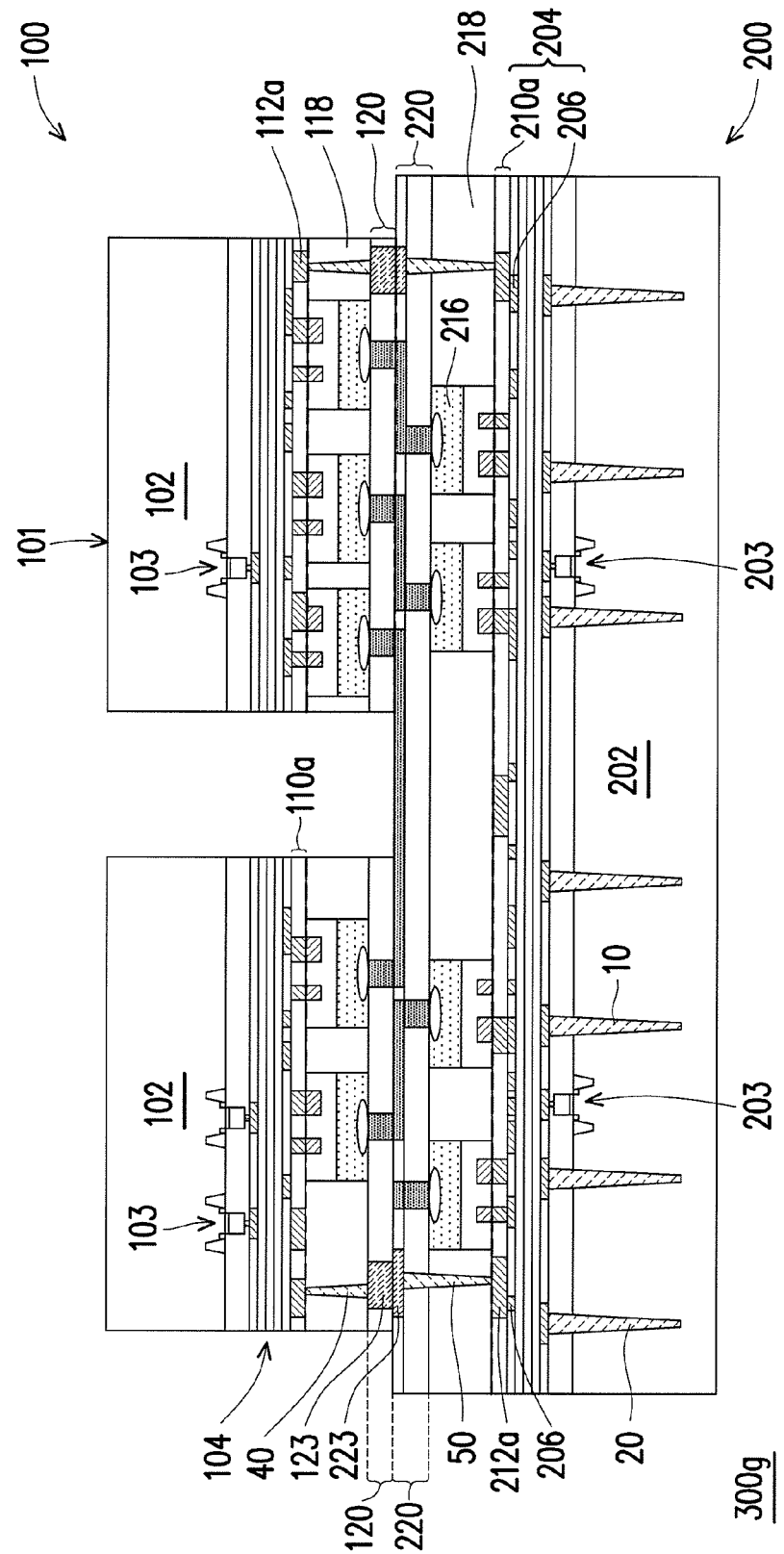
Figure 7C:
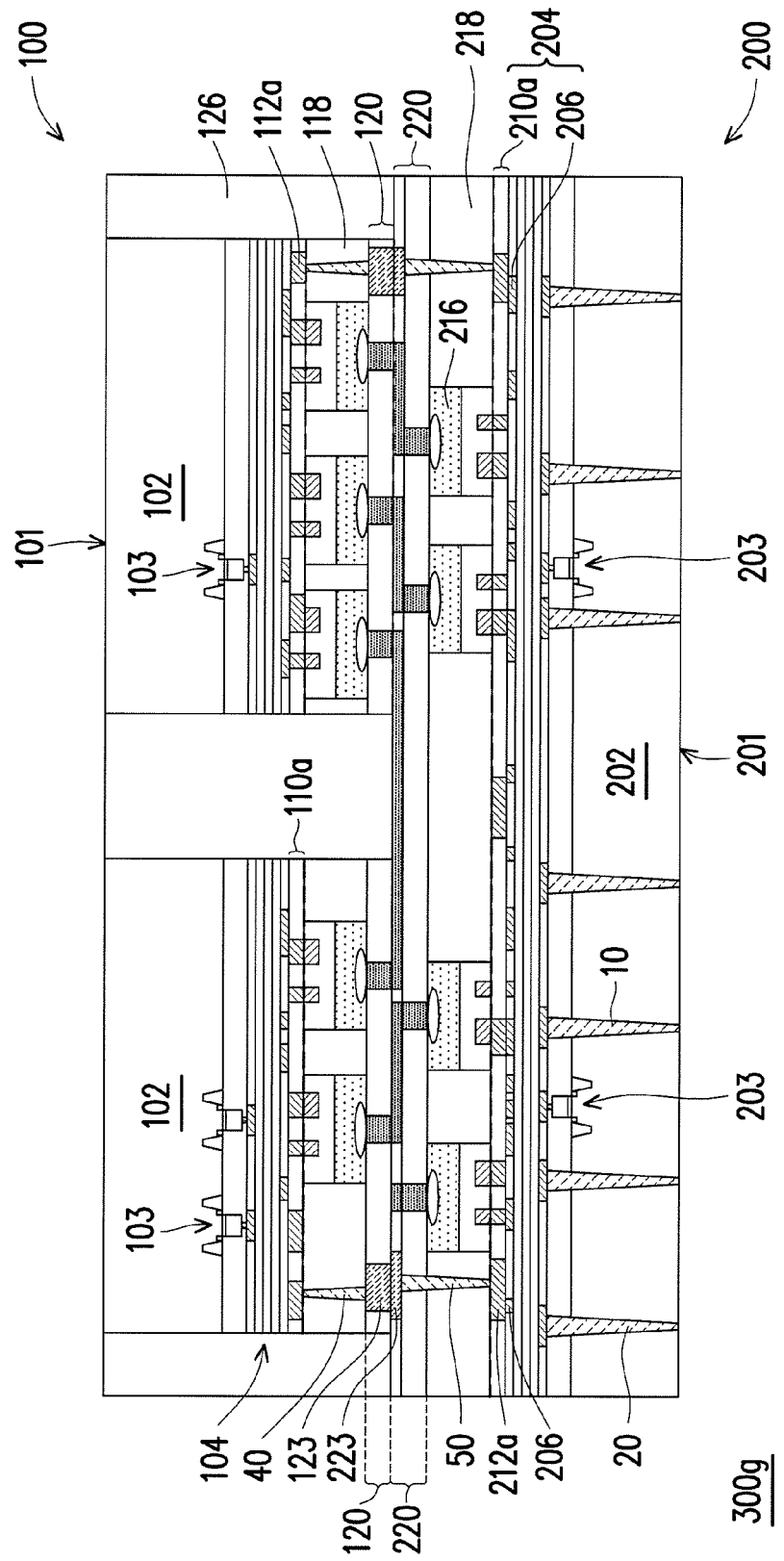
Figure 7D:
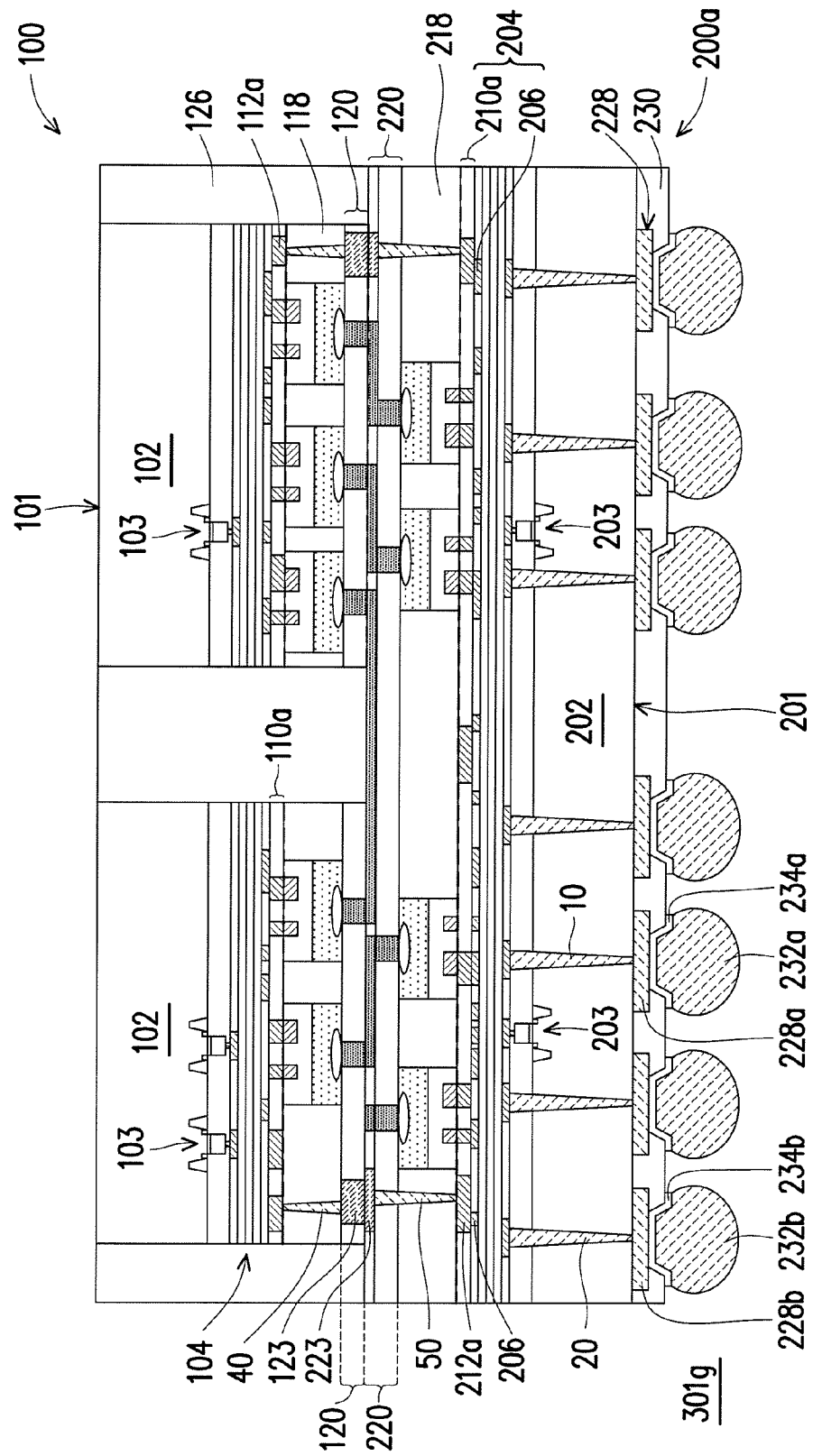

With reference to FIG. 7D, a 3DIC structure 301g of the seventh embodiment is similar to the 3DIC structure 301e of the fifth embodiment. A difference therebetween lies in that, in the 3DIC structure 301g of the seventh embodiment, a first TSV 10 and a second TSV 20 are formed in the second semiconductor substrate 202, and a passivation layer 230, a redistribution (RDL) structure 228 and a first connector 232a and a second connector 232b are formed on the bottom surface 201 of the second semiconductor wafer 200.

Returning to FIG. 7A, the forming method of the first TSV 10 and the second TSV 20 is similar to the method of the fifth embodiment, and the first TSV 10 and the second TSV 20 may be formed in the second semiconductor substrate 202 by a via first method.

Then, with reference to FIG. 7B, similar to the method of the fifth embodiment, after the first IC chip 100 and the second semiconductor wafer 200 are formed, the first IC chip 100 and the second semiconductor wafer 200 are bonded by hybrid bonding.

Next, with reference to FIG. 7C, an encapsulant 126 is formed by the method of the third embodiment. Thereafter, a thinning process of the second semiconductor substrate 202 is performed, by which the back surface of the second semiconductor substrate 202 is polished to remove an excess of the second semiconductor substrate 202, so as to expose the first TSV 10 and the second TSV 20.

With reference to FIG. 7D, the subsequent processes are performed with reference to the method of the fifth embodiment. The first connector 232a is electrically connected with a second optical active component 216 via a first UBM layer 234a, a first metal pad 228 of the redistribution (RDL) structure 228, the first TSV 10, and a second metallization structure 204. The second connector 232b is electrically connected with a first bonding layer 110a of a first metallization structure 104 via a second UBM layer 234b, a second metal pad 228b of the redistribution (RDL) structure 228, the second TSV 20, the second metallization structure 204, a second via 50, a second conductive material 223, a first conductive material 123, and a first via 40.

Figure 8:
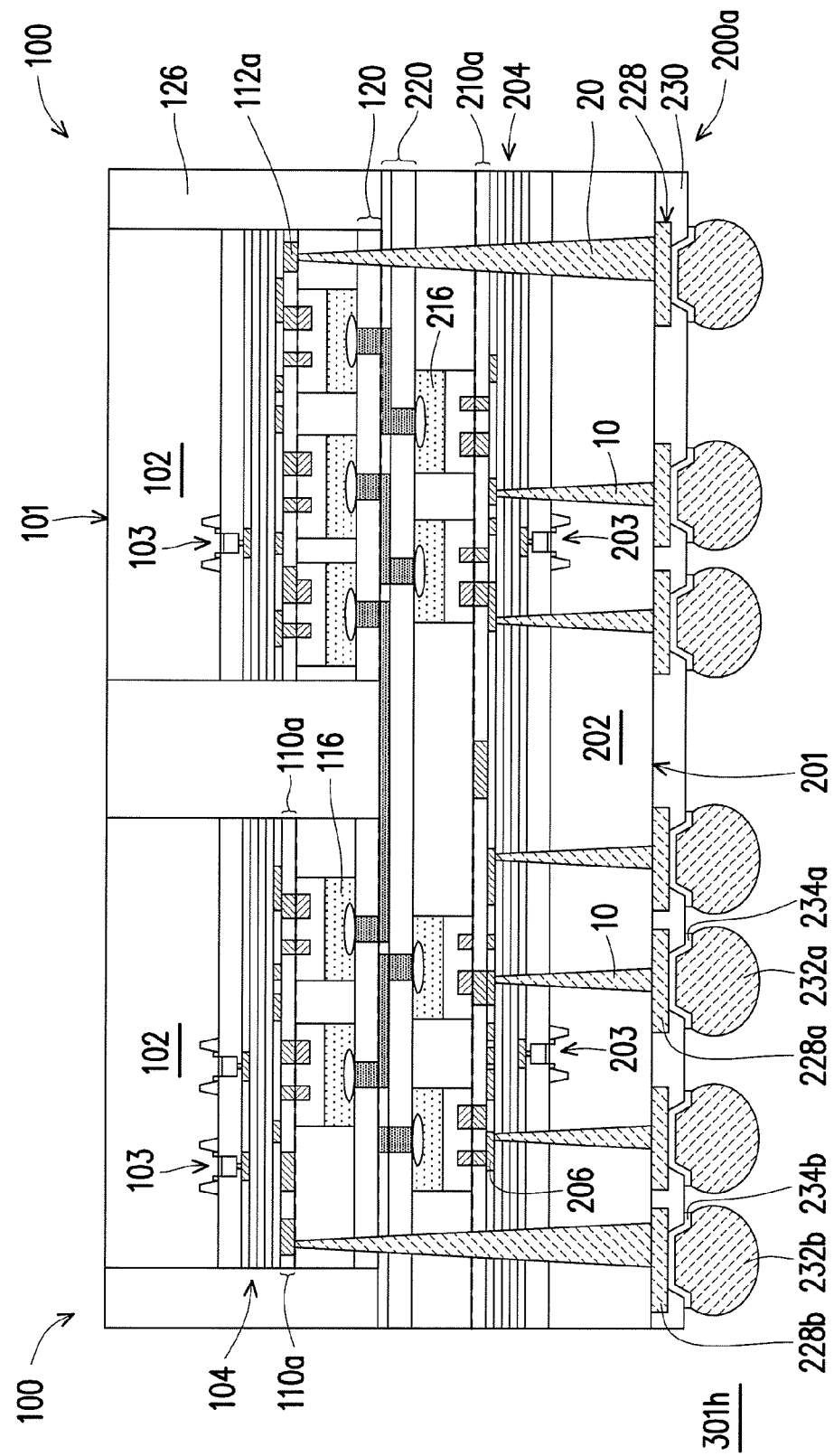
FIG. 8 is a cross-sectional view of a 3DIC structure in accordance with an eighth embodiment.

FIG. 8 is a cross-sectional view of a 3DIC structure in accordance with an eighth embodiment.

With reference to FIG. 8, a 3DIC structure 301h of the eighth embodiment is similar to the 3DIC structure 301a of the first embodiment. A difference therebetween lies in that, in the 3DIC structure 301h of the eighth embodiment, a first TSV 10 and a second TSV 20 penetrate the second semiconductor substrate 202, a passivation layer 230, a redistribution (RDL) structure 228 and a first connector 232a and a second connector 232b are formed over the bottom surface 201 of the second IC Chip 200a. More specifically, the first TSV 10 of the eighth embodiment extends from the bottom surface 201 of the second semiconductor substrate 202 to a conductive line layer 206 (e.g., top conductive line layer) of a second metallization structure 204, and the conductive line layer 206 is connected with a third bonding layer 210a. The first connector 232a is electrically connected with the second optical active component 216 via a first UBM layer 234a, a first metal pad 228a of the redistribution (RDL) structure 228, the first TSV 10, and the conductive line layer 206 of the second metallization structure 204. The second TSV 20 extends from the bottom surface 201 of the second semiconductor substrate 202 to the first bonding layer 110a of the first metallization structure 104 of the first IC Chip 100. The second connector 232b is electrically connected with the first bonding layer 110a of the first metallization structure 104 via a second UBM layer 234b, a first metal pad 228b of the redistribution (RDL) structure 228, and the second TSV 20.

Figure 9:
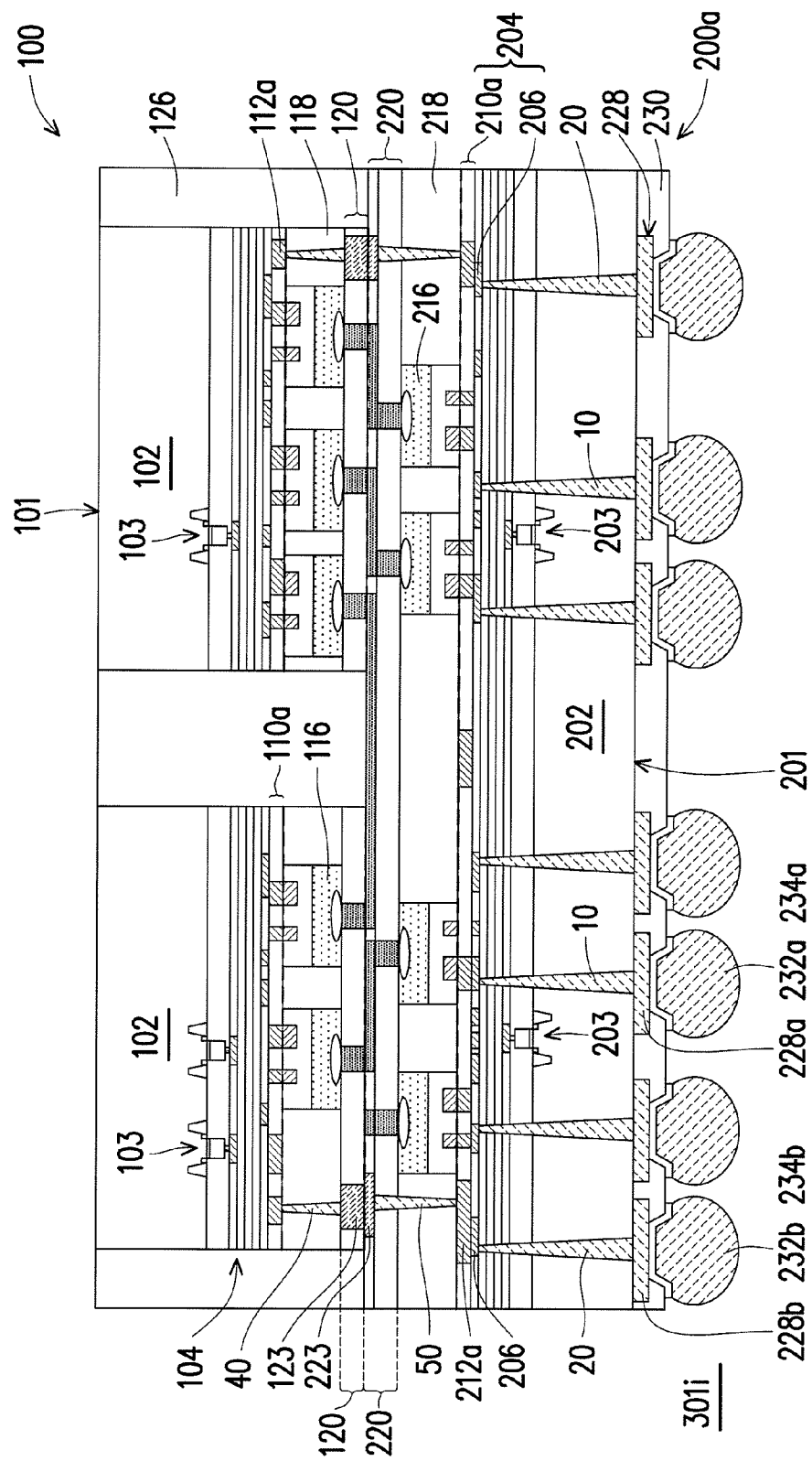
FIG. 9 is a cross-sectional view of a 3DIC structure in accordance with a ninth embodiment.

FIG. 9 is a cross-sectional view of a 3DIC structure in accordance with a ninth embodiment.

With reference to FIG. 9, a 3DIC structure 301i of the ninth embodiment is similar to the 3DIC structure 301c of the third embodiment. A difference therebetween lies in that, in the 3DIC structure 301i of the ninth embodiment, a first TSV 10 and a second TSV 20 penetrate a second semiconductor substrate 202, and a passivation layer 230, a redistribution (RDL) structure 228 and a first connector 232a and a second connector 232b are formed over the bottom surface 201 of the second IC Chip 200a. In addition, a first via 40 passes through a first insulating material 118 to connect with a first bonding layer 110a of a first metallization structure 104.

The first TSV 10 of the ninth embodiment extends from the bottom surface 201 of the second semiconductor substrate 202 to a conductive line layer 206 (e.g., top conductive line layer) of a second metallization structure 204. The first connector 232a is electrically connected with a second optical active component 216 via a first UBM layer 234a, a first metal pad 228a, the first TSV 10, and the conductive line layer 206 of the second metallization structure 204. The second TSV 20 of the ninth embodiment extends from the bottom surface 201 of the second semiconductor substrate 202 to the conductive line layer 206 (e.g., top conductive line layer) of the second metallization structure 204. The second connector 232b is electrically connected with the first bonding layer 110a of the first metallization structure 104 via a second UBM layer 234b, a second metal pad 228b, the second TSV 20, a third bonding layer 210a of the second metallization structure 204, a second via 50, a second conductive material 223, a first conductive material 123, and a first via 40.

FIGS. 10A to 10G are cross-sectional views of a method of forming a 3DIC structure in accordance with a tenth embodiment.

Figure 10A:
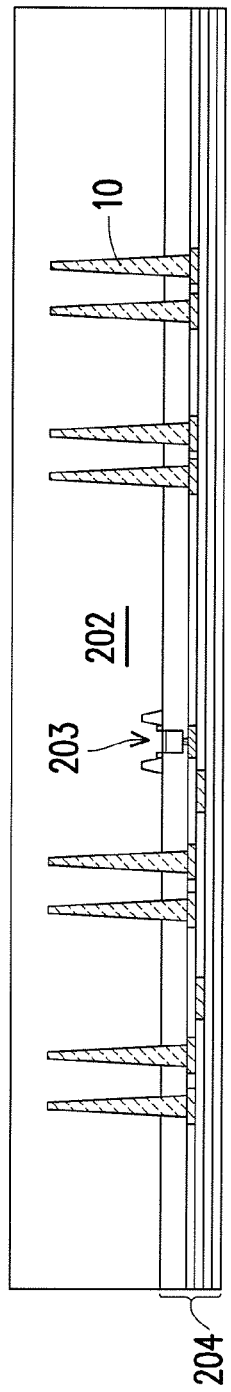
FIGS. 10A to 10G are cross-sectional views of a method of forming a 3DIC structure in accordance with a tenth embodiment.
Figure 10B:
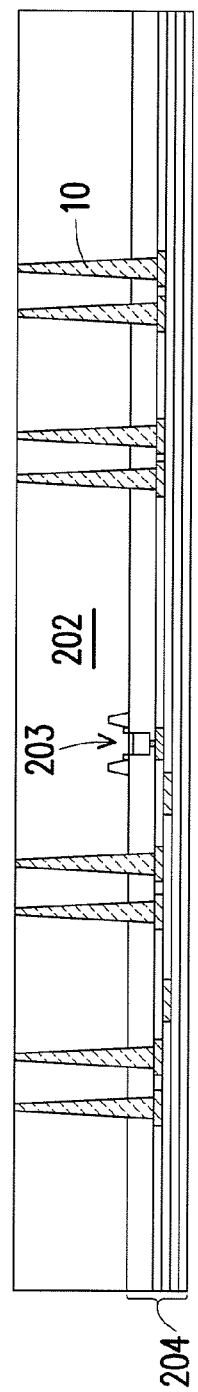
Figure 10C:
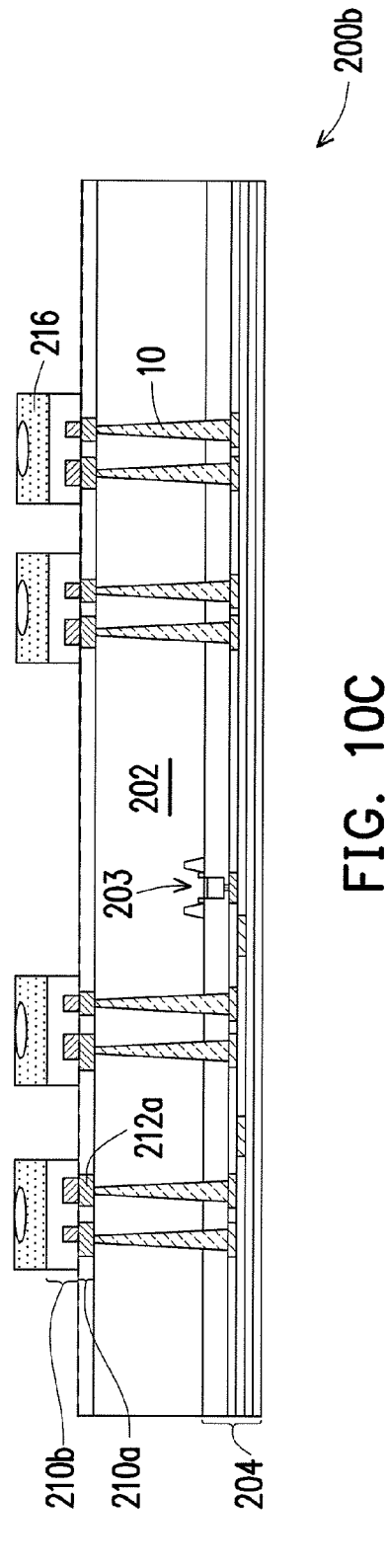
Figure 10D:
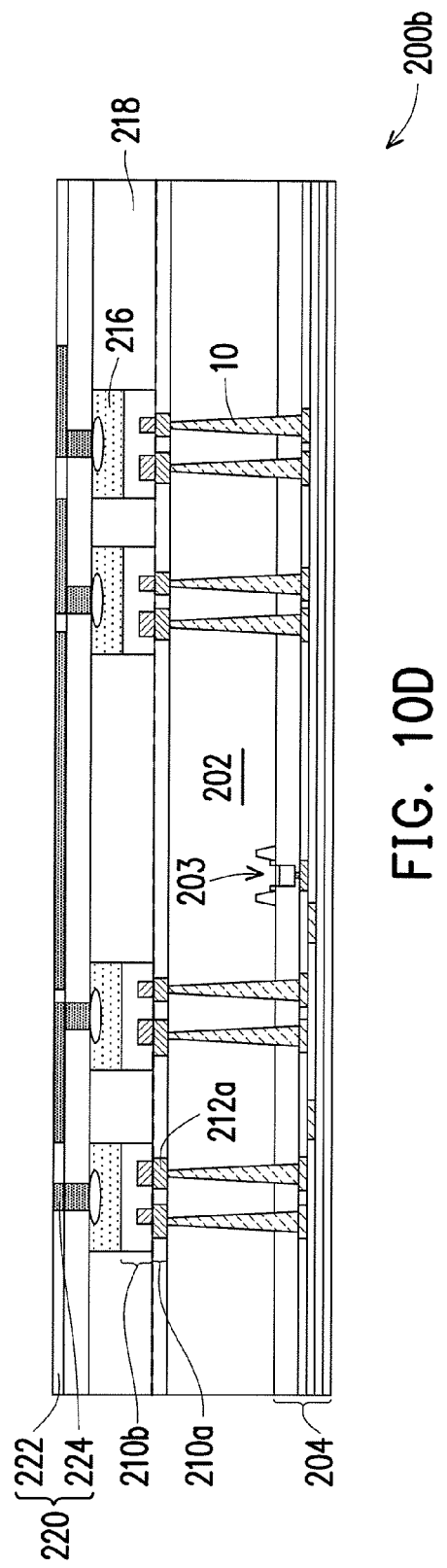
Figure 10E:
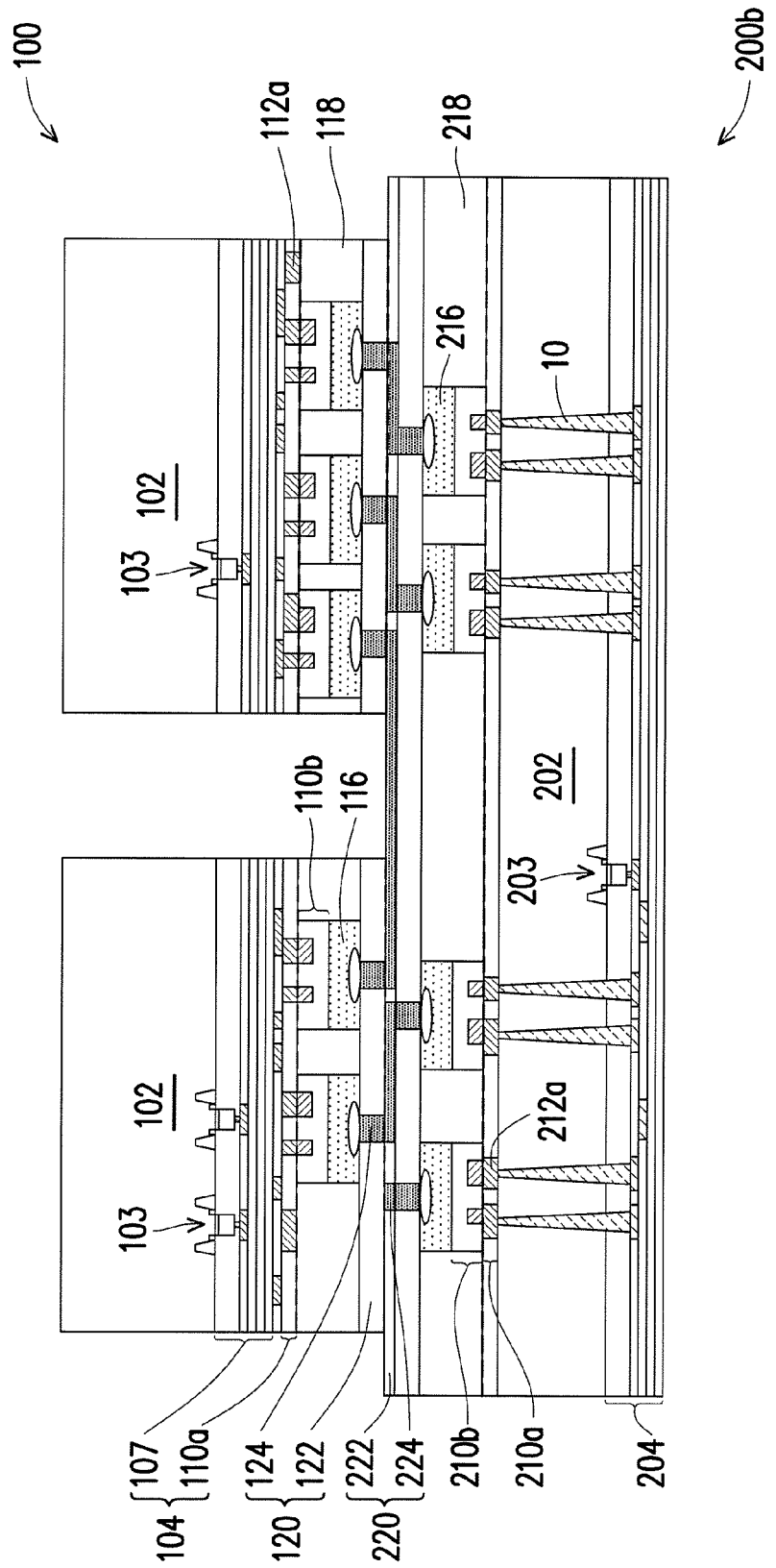
Figure 10F:
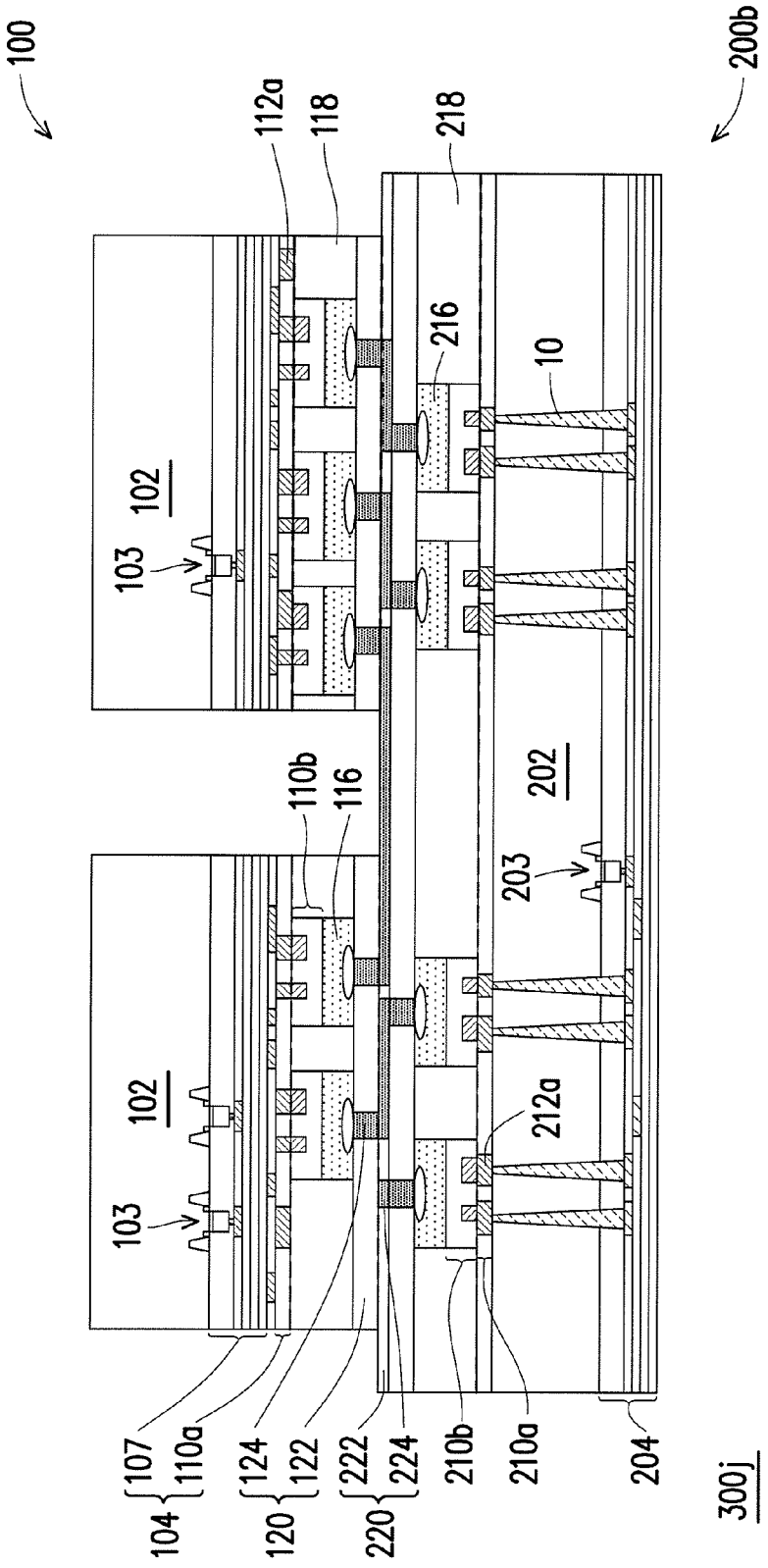
Figure 10G:
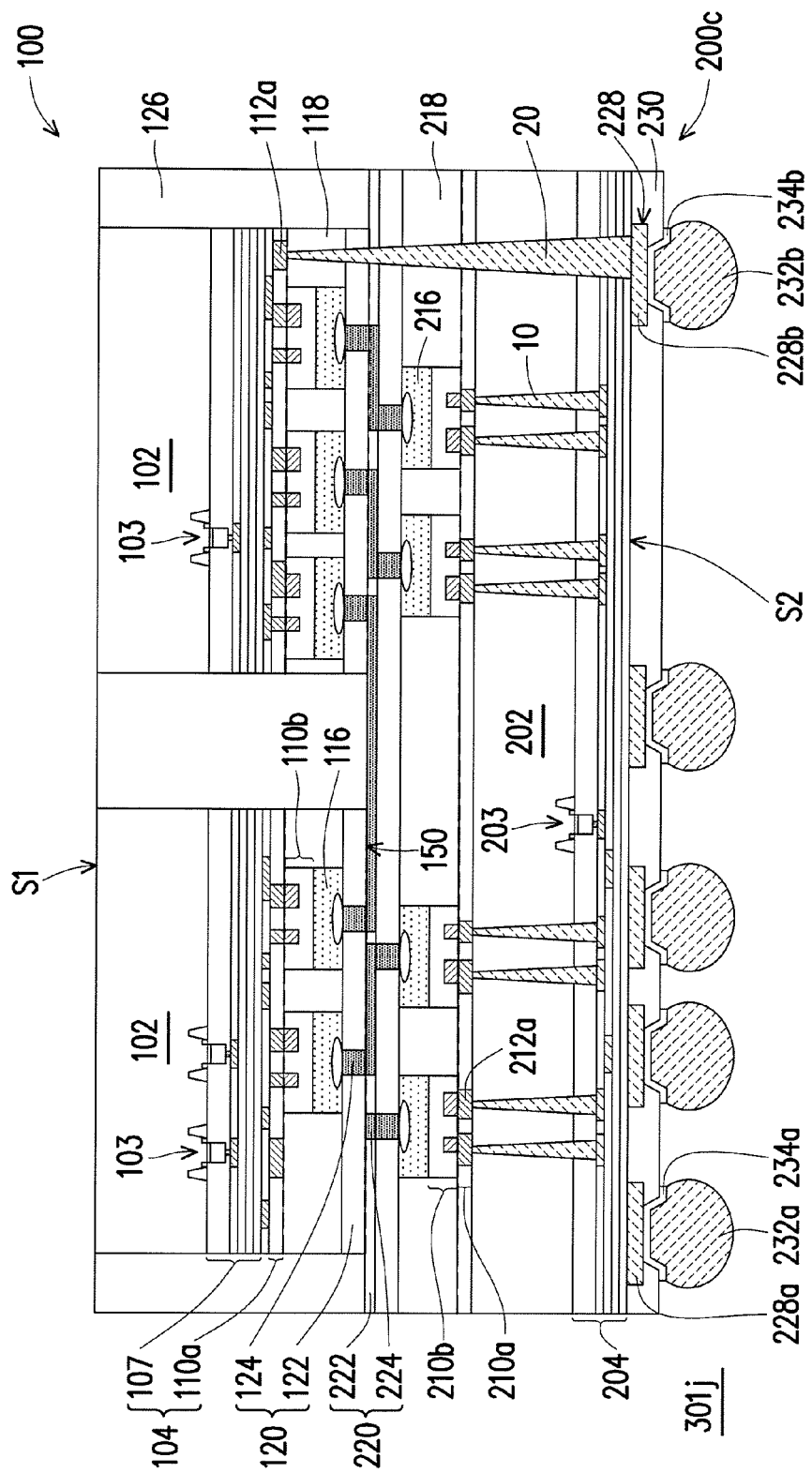

With reference to FIG. 10G and FIG. 8, a 3DIC 301j of the tenth embodiment is similar to the 3DIC 301h of the eighth embodiment. A difference therebetween lies in that an IC chip 200c in the 3DIC 301j of the tenth embodiment differs from the second IC chip 200a in the 3DIC 301h of the second and eighth embodiments.

With reference to FIG. 10G, specifically, the 3DIC 301j of the tenth embodiment include a first IC chip 100 and the second IC chip 200c. A first photonic interconnection layer 120 of the first IC chip 100 and a second photonic interconnection layer 220 of the second IC chip 200c are bonded to form an interface 150. The first IC chip 100 includes a first substrate 102, a first metallization structure 104, a first optical active component 116, and the first photonic interconnection layer 120 from a first surface S1 to the interface 150.

With reference to FIG. 10G, the second IC chip 200c includes a passivation layer 230, a RDL structure 228, a second metallization structure 204, a second substrate 202, a third bonding layer 210a, a second optical active component 216, and the second photonic interconnection layer 220 from a second surface S2 to the interface 150.

With reference to FIG. 10G, a first TSV 10 passes through the second substrate 202 to connect the second metallization structure 204 and the third bonding layer 210a located on two sides of the second substrate 202. A first connector 232a is located over the second surface S2 of the second IC chip 200c and may be electrically connected with the second optical active component 216 in the second IC chip 200c via a first UBM layer 234a, a first metal pad 228a, the second metallization structure 204, the first TSV 10, and the third bonding layer 210a. Moreover, a second TSV 20 passes through the second metallization structure 204 and the second substrate 202 from the second surface S2 of the second IC chip 200c, and extends to the first bonding layer 110a of the first metallization structure 104. The second connector 232b may be electrically connected with the first bonding layer 110a in the first IC chip 100 via a second UBM layer 234b, a first metal pad 228b, and the second TSV 20.

With reference to FIG. 10A, the forming method of the first TSV 10 is the same as the method of the fifth embodiment, and the first TSV 10 may be formed in the second semiconductor substrate 202 by a via first method. In some embodiments, the first TSV 10 is formed in the second semiconductor substrate 202 after the second device regions 203 are formed. The first TSV 10 extends from the front surface toward the back surface of the second semiconductor substrate 202 but does not penetrate the back surface of the second semiconductor substrate 202. The second metallization structure 204 is formed after the first TSV 10 is formed in the second semiconductor substrate 202.

With reference to FIG. 10B, the back surface of the second semiconductor substrate 202 is polished to remove an excess of the second semiconductor substrate 202, so as to expose the first TSV 10.

With reference to FIG. 10C, the third bonding layer 210a of the second metallization structure 204 is formed. Then, the second optical active component 216 and the third bonding layer 210a are bonded.

With reference to FIG. 10D, thereafter, a second insulating material 218 is formed aside the second optical active component 216. A second photonic interconnection layer 220 is formed over the second optical active component 216 and the second insulating materials 218 to form a second semiconductor wafer 200b.

With reference to FIG. 10E, the second semiconductor wafer 200b and the first IC chip 100 formed by the method of the first embodiment are bonded via the first photonic interconnection layer 120 and the second photonic interconnection layer 220.

With reference to FIG. 10F, a thinning process of the first semiconductor substrate 102 is performed, by which the back surface of the first semiconductor substrate 102 is polished to remove an excess of the first semiconductor substrate 102.

With reference to FIG. 10G, an encapsulant 126 is formed aside or around the first IC chip 100. Then, the second TSV 20 is formed. The second TSV 20 passes through the second metallization structure 204 and the second substrate 202 from the second surface S2 of the second semiconductor wafer 200b, and extends to the first bonding layer 110a of the first metallization structure 104. Thereafter, the subsequent processes are performed to form a first UBM layer 234a, a second UBM layer 234b, a first metal pad 228a, a second metal pad 228b, the first connector 232a, and the second connector 232b on the second surface S2 of the second semiconductor wafer 200b. Then, a dicing or singulation process is performed to the stack structure 300j, so as to separate 3DIC structures 301j from each other. In some embodiments, the dicing or singulation process is, for example, a laser cutting process or a mechanical cutting process.

In view of the above, the present disclosure provides a 3DIC structure having optical active components and photonic interconnection layers. The 3DIC structure of the present disclosure transmits data via the photonic interconnection layers. Since the photonic interconnection layers of the present disclosure are made of dielectric materials, no RC delay is observed, and thus, the data rate and bandwidth of the 3DIC structure can be increased. In some embodiments, the first optical active component is bonded to the first IC chip and then the first photonic interconnection layer is formed, thereby forming the first IC chip. Thereafter, the first IC chip is bonded to the second IC chip formed by the same method in a face to face or face to back manner through bonding of the first photonic interconnection layer and the second photonic interconnection layer. Thus, the 3DIC structure of the present disclosure may be formed without using an interposer, and the light generated by the first optical active component of the first IC chip (or the second optical active component of the second IC chip) may be transmitted to the second optical active component of the second IC chip (or the first optical active component of the first IC chip) directly using the first photonic interconnection layer and the second photonic interconnection layer. Accordingly, the 3DIC structure of the present disclosure not only integrates the optical active components on one single chip but also achieves the effects of optical communication, such as high bandwidth, low power, and low cost.

In accordance with some embodiments of the present disclosure, a 3DIC structure includes a first IC chip, a second IC chip, an encapsulant, and a plurality of connectors. The first IC chip includes a first metallization structure, a first optical active component, and a first photonic interconnection layer. The second IC chip includes a second metallization structure, a second optical active component, and a second photonic interconnection layer. The first IC chip and the second IC chip are bonded via the first photonic interconnection layer and the second photonic interconnection layer. The first optical active component is located between the first photonic interconnection layer and the first metallization structure. The second optical active component is located between the second photonic interconnection layer and the second metallization structure.

In accordance with alternative embodiments of the present disclosure, a 3DIC structure includes a first IC chip, a second IC chip, and a plurality of connectors. The first IC chip bonded to the second IC chip and an interface formed therebetween by bonding a first photonic interconnection layer of the first IC chip and a second photonic interconnection layer of the second IC chip. The first IC chip includes a first substrate, a first metallization structure, a first optical active component, and the first photonic interconnection layer from a first surface to the interface. A first bonding layer of the first metallization structure and a second bonding layer of the first optical active component are bonded to each other. The second IC chip includes a RDL of a second metallization structure, a second substrate, a third bonding layer of the second metallization structure, a second optical active component, and the second photonic interconnection layer from a second surface to the interface. The third bonding layer of the second metallization structure and a fourth bonding layer of the second optical active component are bonded to each other. The connectors are over the second surface of the second IC chip and respectively electrically connecting the first IC chip and the second IC chip.

In accordance with yet alternative embodiments of the present disclosure, a 3D integrated circuit structure includes a first IC chip and a second IC chip. The first IC chip includes a first optical active component. The second IC chip includes a second optical active component. The first IC chip and the second IC chip are bonded via a photonic bonding structure, and the photonic bonding structure is located between the first optical active component and the second optical active component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A 3D integrated circuit structure, comprising:
a first IC chip comprising a first metallization structure, a first optical active component, and a first photonic interconnection layer; and
a second IC chip comprising a second metallization structure, a second optical active component, and a second photonic interconnection layer,
wherein the first IC chip and the second IC chip are bonded via the first photonic interconnection layer and the second photonic interconnection layer,
wherein the first optical active component is located between the first photonic interconnection layer and the first metallization structure, and
wherein the second optical active component is located between the second photonic interconnection layer and the second metallization structure,
wherein the first optical active component and the first metallization structure are bonded by a first hybrid bonding structure, and the second optical active component and the second metallization structure are bonded by a second hybrid bonding structure,
wherein the first hybrid bonding structure comprises:
a first bonding layer of the first metallization structure, comprising a first pad in a first dielectric layer; and
a second bonding layer of the first optical active component, comprising a second pad in a second dielectric layer, wherein the first pad and the second pad are bonded to each other, and the first dielectric layer and the second dielectric layer are bonded to each other,
wherein the second hybrid bonding structure comprises:
a third bonding layer of the second metallization structure, comprising a third pad in a third dielectric layer; and
a fourth bonding layer of the second optical active component, comprising a fourth pad in a fourth dielectric layer, wherein the third pad and the fourth pad are bonded to each other, and the third dielectric layer and the fourth dielectric layer are bonded to each other.

2. The 3D integrated circuit structure according to claim 1, further comprising:
an encapsulant disposed aside the first IC chip; and
a plurality of connectors being over a bottom surface of the first IC chip and respectively electrically connecting the first IC chip and the second IC chip.

3. The 3D integrated circuit structure according to claim 2, further comprising:
a first TSV electrically connected with a first connector of the connectors and extending from the bottom surface of the first IC chip to a conductive line layer in the first metallization structure; and
a second TSV electrically connected with a second connector of the connectors and extending from the bottom surface of the first IC chip to the third bonding layer of the second metallization structure,
wherein the first photonic interconnection layer and the second photonic interconnection layer are bonded by dielectric-to-dielectric bonding.

4. The 3D integrated circuit structure according to claim 3, further comprising a through dielectric via (TDV) electrically connected with a third connector of the connectors and penetrating through the encapsulant from the bottom surface of the first IC chip to the third bonding layer of the second metallization structure.

5. The 3D integrated circuit structure according to claim 2, further comprising:
a first TSV electrically connected with a first connector of the connectors and extending from the bottom surface of the first IC chip to a conductive line layer in the first metallization structure;
a second TSV electrically connected with a second connector of the connectors and extending from the bottom surface of the first IC chip to the conductive line layer in the first metallization structure;
a first via passing through a first insulating material aside the first optical active component and the first bonding layer and connected with the conductive line layer of the first metallization structure;
a first conductive material in the first photonic interconnection layer and connected with the first via;
a second conductive material in the second photonic interconnection layer and bonded to the first conductive material; and
a second via connected with the second conductive material and passing through the second photonic interconnection layer and a second insulating material aside the second optical active component and connected with the third bonding layer,
wherein the first IC chip and the second IC chip are bonded by hybrid bonding.

6. The 3D integrated circuit structure according to claim 5, further comprising a TDV electrically connected with a third connector of the connectors and penetrating through the encapsulant from the bottom surface of the first IC chip to the third bonding layer of the second metallization structure.

7. The 3D integrated circuit structure according to claim 2, further comprising:
a first TSV electrically connected with a first connector of the connectors and extending from a first conductive line layer of the first metallization structure to the bottom surface of the first IC chip;
a second TSV electrically connected with a second connector of the connectors and extending from the first conductive line layer of the first metallization structure to the bottom surface of the first IC chip;
a first via passing through a first insulating material aside the first optical active component and the first bonding layer and connected with a second conductive line layer of the first metallization structure;
a first conductive material in the first photonic interconnection layer and connected with the first via;
a second conductive material in the second photonic interconnection layer and bonded to the first conductive material; and
a second via connected with the second conductive material and passing through a second insulating material aside the second optical active component and the second photonic interconnection layer and connected with the third bonding layer,
wherein the first IC chip and the second IC chip are bonded by hybrid bonding.

8. The 3D integrated circuit structure according to claim 7, further comprising a through dielectric via (TDV) electrically connected with a third connector of the connectors and penetrating through the encapsulant from the bottom surface of the first IC chip to the third bonding layer of the second metallization structure.

9. The 3D integrated circuit structure according to claim 1, further comprising:
an encapsulant disposed aside the first IC chip; and
a plurality of connectors being over a bottom surface of the second IC chip and respectively electrically connecting the first IC chip and the second IC chip.

10. The 3D integrated circuit structure according to claim 9, further comprising:
a first TSV electrically connected with a first connector of the connectors and extending from a conductive line layer of the second metallization structure to the bottom surface of the second IC chip;
a first via passing through a first insulating material aside the first optical active component and connected with the first bonding layer;
a first conductive material in the first photonic interconnection layer and connected with the first via;
a second conductive material in the second photonic interconnection layer and bonded to the first conductive material;
a second via connected with the second conductive material and passing through the second photonic interconnection layer and a second insulating material aside the second optical active component and bonded to the third bonding layer, wherein the first IC chip and the second IC chip are bonded by hybrid bonding; and
a second TSV extending from the conductive line layer in the second metallization structure to the bottom surface of the second IC chip and electrically connected with a second connector of the connectors.

11. The 3D integrated circuit structure according to claim 9, further comprising:
a first TSV electrically connected with a first connector of the connectors and extending from the bottom surface of the second IC chip to a conductive line layer in the second metallization structure; and
a second TSV electrically connected with a second connector of the connectors and extending from the bottom surface of the second IC chip to the first bonding layer of the first metallization structure,
wherein the first IC chip and the second IC chip are bonded by dielectric bonding.

12. The 3D integrated circuit structure according to claim 9, further comprising:
a first TSV electrically connected with a first connector of the connectors and extending from the bottom surface of the second IC chip to a conductive line layer in the second metallization structure;
a first via passing through a first insulating material aside the first optical active component and connected with the first bonding layer;
a first conductive material in the first photonic interconnection layer and connected with the first via;
a second conductive material in the second photonic interconnection layer and bonded to the first conductive material;
a second via connected with the second conductive material and passing through the second photonic interconnection layer and a second insulating material aside the second optical active component and connected with the third bonding layer; and
a second TSV electrically connected with a second connector of the connectors and extending from the bottom surface of the second IC chip to the conductive line layer of the first metallization structure,
wherein the first IC chip and the second IC chip are bonded by hybrid bonding.

13. The 3D integrated circuit structure according to claim 1, wherein a combination of the first photonic interconnection layer and the second photonic interconnection layer comprises:
a first dielectric material layer; and
a second dielectric material layer in the first dielectric material layer, wherein an index of refraction of the second dielectric material layer is greater than an index of refraction of the first dielectric material layer.

14. The 3D integrated circuit structure according to claim 1, wherein
the first IC chip comprises a first substrate, the first metallization structure, the first optical active component and the first photonic interconnection layer from a first surface to an interface, wherein the interface is between the first IC chip and the second IC chip; and the second IC chip comprises a RDL structure, a portion of the second metallization structure, a second substrate, the third bonding layer of the second metallization structure, the second optical active component and the second photonic interconnection layer from a second surface to the interface.

15. The 3D integrated circuit structure according to claim 14, wherein
a plurality of connectors being over the second surface of the second IC chip and respectively electrically connecting the first IC chip and the second IC chip.

16. A 3D integrated circuit structure, comprising:
a first IC chip comprising a first photonic interconnection layer;
a second IC chip comprising a second photonic interconnection layer; and
a third IC chip comprising a third photonic interconnection layer, wherein the first, the second and the third photonic interconnection layers are bonded to serve as a photonic bonding structure, wherein the first and the third IC chips are bonded with the second IC chip through the photonic bonding structure, and a light is transmitted between the first and the third IC chips through the photonic bonding structure, wherein the first IC chip further comprises a first optical active component, the second IC chip further comprises a second optical active component, and the third IC chip further comprises a third optical active component, the photonic bonding structure is located between the first and the second optical active components, and between the third and the second optical active components, and the light is transmitted between the first and the third optical active components through the photonic bonding structure.

* * * * *